(12) United States Patent
Zhang et al.

(10) Patent No.: US 12,538,622 B2
(45) Date of Patent: Jan. 27, 2026

(54) DISPLAY PANEL AND DISPLAY APPARATUS

(71) Applicant: Xiamen Tianma Display Technology Co., Ltd., Xiamen (CN)

(72) Inventors: Yuheng Zhang, Xiamen (CN); Guoxing Chen, Xiamen (CN); Jiemiao Pan, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 555 days.

(21) Appl. No.: 17/985,925

(22) Filed: Nov. 14, 2022

(65) Prior Publication Data

US 2024/0088338 A1    Mar. 14, 2024

(30) Foreign Application Priority Data

Sep. 9, 2022   (CN) .......................... 202211103657.1

(51) Int. Cl.
| | |
|---|---|
| *H10H 20/857* | (2025.01) |
| *H01L 25/075* | (2006.01) |
| *H10H 20/831* | (2025.01) |

(52) U.S. Cl.
CPC ....... *H10H 20/857* (2025.01); *H01L 25/0753* (2013.01); *H10H 20/8312* (2025.01)

(58) Field of Classification Search
CPC .............. H10H 20/857; H10H 20/8312; H01L 25/0753; H10K 59/1213; H10K 59/1216; H10K 59/131
See application file for complete search history.

(56) References Cited

U.S. PATENT DOCUMENTS

| | | | | |
|---|---|---|---|---|
| 10,671,197 | B2* | 6/2020 | Guo et al. | G02F 1/136286 |
| 11,995,280 | B2* | 5/2024 | Long et al. | G06F 3/0443 |
| 2016/0253541 | A1* | 9/2016 | Yang et al. | G09G 3/3233 |
| | | | | 382/124 |
| 2024/0334770 | A1* | 10/2024 | Chen et al. | H10K 59/131 |

FOREIGN PATENT DOCUMENTS

| | | |
|---|---|---|
| CN | 113517327 A | 10/2021 |
| CN | 114464134 A | 5/2022 |

* cited by examiner

*Primary Examiner* — Christine S. Kim
*Assistant Examiner* — Nathalie R Fayette
(74) *Attorney, Agent, or Firm* — East IP P.C.

(57) ABSTRACT

The embodiments of the present application provide a display panel and a display apparatus. The display panel includes a plurality of light-emitting elements including a first-color light-emitting element and a second-color light-emitting element; a plurality of conductive parts electrically connected to the light-emitting elements, wherein in the plurality of conductive parts, a conductive part electrically connected to the first-color light-emitting element is a first conductive part, and a conductive part electrically connected to the second-color light-emitting element is a second conductive part; and a first scan signal line overlapped with and insulated from the conductive parts, wherein an overlapping area of the first scan signal line and the first conductive part is larger than an overlapping area of the first scan signal line and the second conductive part.

19 Claims, 11 Drawing Sheets

DISPLAY PANEL AND DISPLAY APPARATUS

CROSS REFERENCE TO RELATED APPLICATION

This application claims priority to Chinese Patent Application No. 202211103657.1, filed on Sep. 9, 2022, which is hereby incorporated by reference in its entirety.

TECHNICAL FIELD

The present application relates to a field of display technology, and particularly to a display panel and a display apparatus.

BACKGROUND

Display technology is widely used for a television and a mobile phone and a display for public information, and display panels used for displaying pictures are also various, and the display panels may display colorful pictures. However, the display panels suffer from a color cast problem when displaying.

SUMMARY

Embodiments of the present application provide a display panel and a display apparatus.

In a first aspect, the embodiments of the present application provides a display panel, including: a plurality of light-emitting elements including a first-color light-emitting element and a second-color light-emitting element; a plurality of conductive parts electrically connected to the light-emitting elements, wherein in the plurality of conductive parts, a conductive part electrically connected to the first-color light-emitting element is a first conductive part, and a conductive part electrically connected to the second-color light-emitting element is a second conductive part; and a first scan signal line overlapped with and insulated from the conductive parts, wherein an overlapping area of the first scan signal line and the first conductive part is larger than an overlapping area of the first scan signal line and the second conductive part.

In a second aspect, the embodiments of the present application provides a display panel, including: a first scan signal line; and a plurality of sub-pixels, wherein each sub-pixel includes a pixel circuit, a light-emitting element and a coupling capacitor, and the coupling capacitor is connected between the first scan signal line and the light-emitting element, wherein the plurality of sub-pixels includes a first-color sub-pixel and a second-color sub-pixel, the coupling capacitor of the first-color sub-pixel is a first coupling capacitor, and the coupling capacitor of the second-color sub-pixel is a second coupling capacitor, and a capacitance of the first coupling capacitor is greater than a capacitance of the second coupling capacitor.

In a third aspect, the embodiments of the present application provides a display apparatus, including the display panel provided in the first aspect or the display panel provided in the second aspect.

BRIEF DESCRIPTION OF THE DRAWINGS

In order to explain the technical solutions of the embodiments of the present application more clearly, the following briefly introduces the drawings that need to be used in the embodiments of the present application. For those ordinary skilled in the art, other drawings may further be obtained from these drawings without the exercise of inventive faculty.

DETAILED DESCRIPTION

Figure 1:
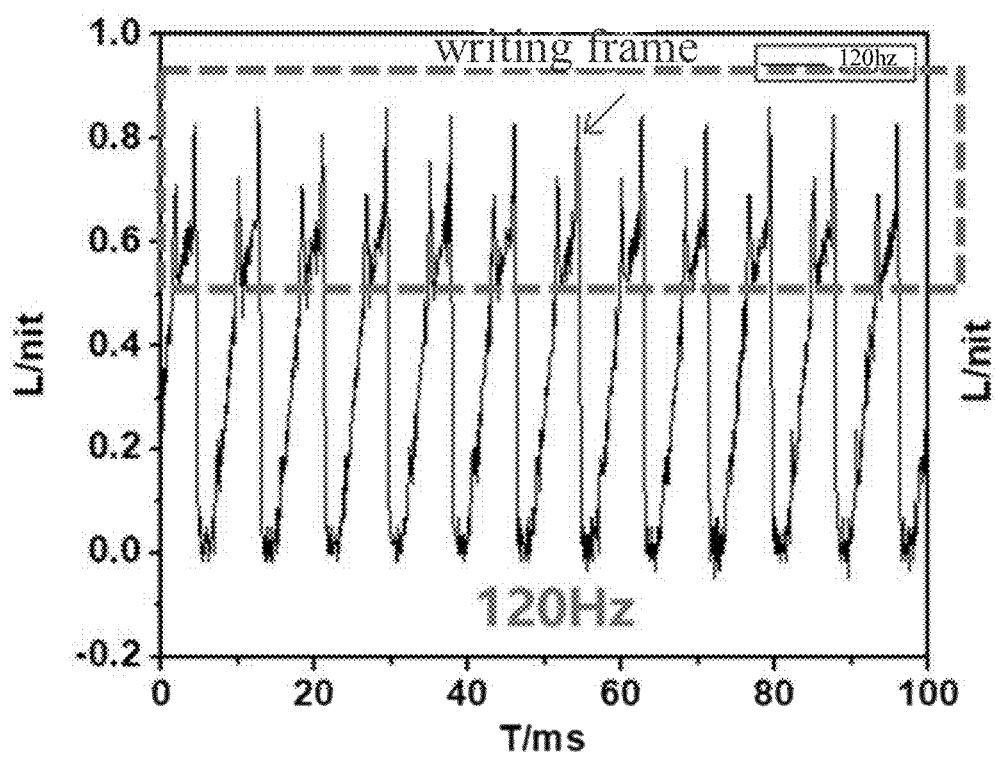
FIG. 1 is a schematic diagram of brightness variations of a light-emitting element under a condition that a refresh rate is 120 Hz.

The features and exemplary embodiments of various aspects of the present application will be described in detail below. In order to make the purpose, technical solutions and advantages of the present application more clear, the present application will be further described in detail below with reference to the accompanying drawings and specific embodiments. It should be understood that the specific embodiments described herein are only intended to explain the present application, and are not intended to limit the present application. It will be apparent to those skilled in the art that the present application may be practiced without some of these specific details. The following description of the embodiments is merely to provide a better understanding of the present application by illustrating examples of the present application.

It should be noted that, relational terms such as first and second herein are used only to distinguish one entity or operation from another entity or operation, and do not necessarily require or imply that any such relationship or sequence actually exists among these entities or operations. In addition, the terms "include", "comprise" or any other variation thereof are intended to encompass non-exclusive inclusion, such that a process, method, article or device which includes a list of elements includes not only those elements, but also other elements which are not explicitly listed or elements inherent to such process, method, article or device. Without further limitation, an element defined by the phrase "include" does not preclude the presence of additional identical elements in the process, method, article, or device that includes the element.

It should be understood that the term "and/or" used in this document is only to describe an association relationship of associated objects, which indicates that there may be three kinds of relationships. For example, A and/or B may indicate three cases of A existing alone, A and B existing at the same time, and B existing alone. In addition, the character "/" herein generally indicates that related objects have an "or" relationship.

It should be noted that, a transistor in the embodiments of the present application may be an N-type transistor or a P-type transistor, unless the type of the transistor is specifically described. For an N-type transistor, a turn-on level is a high level, and a turn-off level is a low level. That is, when a gate of the N-type transistor is at a high level, a connection between a first electrode and a second electrode thereof is turned on, and when the gate of the N-type transistor is at a low level, the connection between the first electrode and the second electrode thereof is turned off. For a P-type transistor, a turn-on level is a low level, and a turn-off level is a high level. That is, when a gate of the P-type transistor is at a low level, a connection between a first electrode and a second electrode thereof is turned on, and when the gate of the P-type transistor is at a high level, the connection between the first electrode and the second electrode thereof is turned off. In specific implementation, the gate of each transistor is used as a control electrode, and the first electrode of the transistor may be a source and the second electrode may be a drain, or the first electrode of the transistor may be the drain and the second electrode may be the source, dependent on a signal applied on the gate and its type, which will not be distinguished herein. In addition, both of the turn-on level and the turn-off level in the embodiments of the present application have a general meaning, and the on-level refers to any level that may make the transistor turn on, and the turn-off level refers to any level that may make the transistor turn off.

In the embodiments of the present application, the term "electrical connection" may refer to a direct electrical connection between two components, or may refer to an electrical connection between the two components via one or more other components.

In the embodiments of the present application, a first node is only defined for the convenience of describing a circuit structure, and the first node is not an actual circuit unit.

It will be apparent to those skilled in the art that various modifications and variations may be made in the present application without departing from the spirit or scope of the present application. Thus, the present application is intended to cover the modifications and variations of the present application that fall within the scope of the corresponding claims (claimed technical solutions) and their equivalents. It should be noted that the implementation manners provided by the embodiments of the present application may be combined with one another if there is no contradiction.

Before describing the technical solutions provided by the embodiments of the present application, in order to facilitate the understanding of the embodiments of the present application, the present application first specifically describes the problems existed in the prior art.

A pixel circuit is fabricated by a film stacking process, in which same structures of respective transistors in the pixel circuit (for example, active layers, gates, sources/drains, etc.) are generally formed in a same process, and thus the respective transistors in the pixel circuit are distributed in a plane. In order to facilitate a connection between a signal line and a corresponding transistor in the pixel circuit, generally, the signal line is to extend to the neighborhood of the transistor, to realize an electrical connection through a via, or to be directly reused as a portion of the transistor, such as the gate of the transistor, etc. Therefore, the signal line is to pass through the inside of the pixel circuit, and there will be parasitic capacitor (or coupling capacitor) between the signal line and other parts of the pixel circuit.

FIG. 1 is a schematic diagram of brightness variations of a light-emitting element under a condition that a refresh rate is 120 Hz. A horizontal axis of FIG. 1 represents time, in milliseconds (ms), and a vertical axis of FIG. 1 represents brightness, in nits (nit). As shown in FIG. 1, when a signal output by the signal line is switched from a low level to a high level (that is, when jumping to high level), under an influence of the parasitic capacitor, the brightness of the light-emitting element will rise (as indicated by an arrow in FIG. 1).

The inventors of the present application have found that capacitances of equivalent capacitors of light-emitting elements of different colors (taking OLED capacitors as an example) are different due to an influence of factors such as materials. For example, the capacitance of the equivalent capacitor of a first-color light-emitting element is greater than the capacitance of the equivalent capacitor of a second-color light-emitting element, and on this basis, the parasitic capacitor will cause different influences on the light-emitting elements of different colors. For example, under an influence of same parasitic capacitor, a brightness rise degree of the first-color light-emitting element will be smaller than a brightness rise degree of the second-color light-emitting element, resulting in an increased difference between a brightness of the first-color light-emitting element and a brightness of the second-color light-emitting element. That is, a color cast problem is occurred. Especially in the case of low grayscale, the brightness of the light-emitting element is low, and the difference between the brightness of the first-color light-emitting element and the brightness of the second-color light-emitting element is easily to be perceived by human eyes, resulting in a particularly obvious color cast problem perceived.

In view of the above research findings of the inventors, the embodiments of the present application provide a display panel and a display apparatus, which can solve the technical problem of color cast of the display panel existed in the related art.

The technical concept of the embodiments of the present application is to adjust the capacitance of the coupling capacitor generated between the first scan signal line and the first-color light-emitting element to be larger than the capacitance of the coupling capacitor generated between the first scan signal line and the second-color light-emitting element, so as to solve the problem that the influence on the brightness of the first-color light-emitting element by the of the coupling capacitor is different from the influence on the brightness of the second-color light-emitting element by the coupling capacitor, and to reduce a difference between a brightness rise degree of the first-color light-emitting element by the coupling capacitor and a brightness rise degree of the second-color light-emitting element by the coupling capacitor when the signal on the first scan signal line is jumped to a another level, and to improve the color cast problem.

The display panel provided by the embodiments of the present application is first introduced below.

Figure 2:
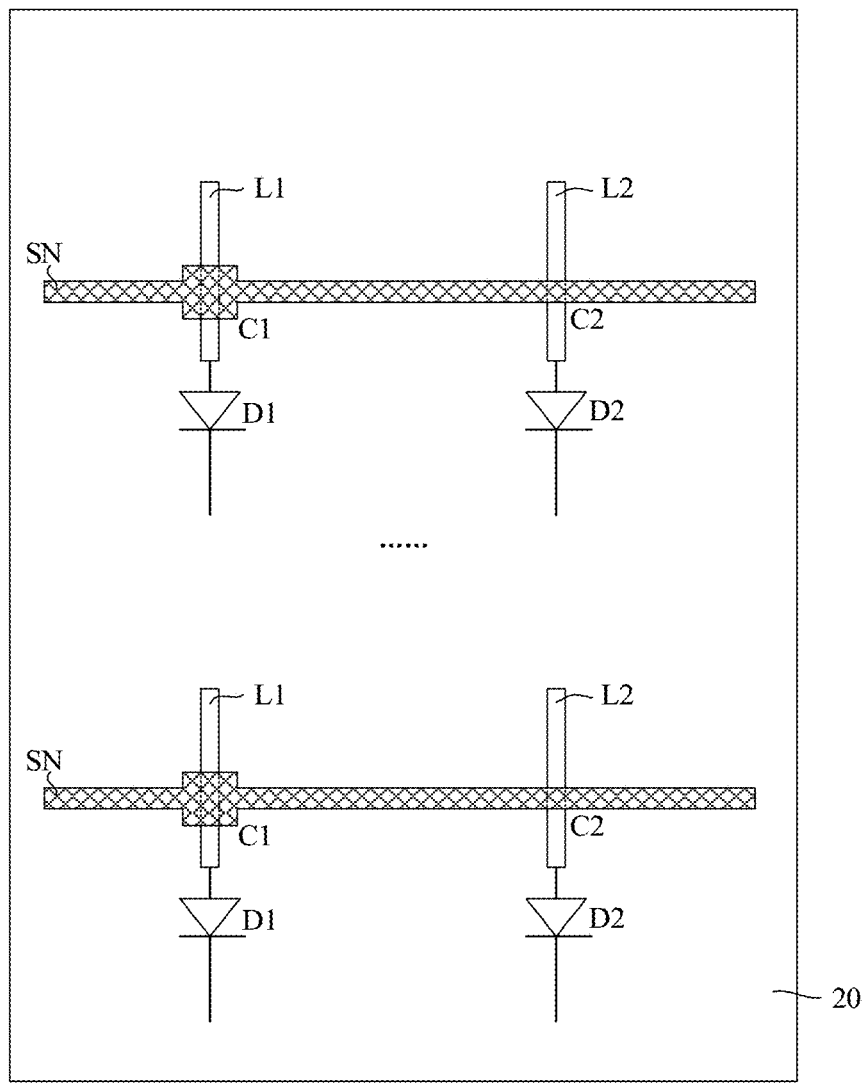
FIG. 2 is a schematic structure diagram of a portion of a display panel provided by the embodiments of the present application.

FIG. 2 is a schematic structure diagram of a portion of a display panel provided by the embodiments of the present application. As shown in FIG. 2, the display panel 20 provided by the embodiment of the present application includes a plurality of light-emitting elements D, such as a first-color light-emitting element D1 and a second-color light-emitting element D2. The display panel 20 may further include a plurality of conductive parts L, and the conductive parts L are electrically connected to the light-emitting elements D. For ease of description, a conductive part L electrically connected to the first-color light-emitting element D1 is referred to as a first conductive part L1, and a conductive part L electrically connected to the second-color light-emitting element D2 is referred to as a second conductive part L2. The display panel 20 may further include a first scan signal line SN, and the first scan signal line SN may be electrically connected to a gate of a transistor in a pixel circuit to control a turn-on/turn-off of the transistor.

Exemplarily, the first conductive part L1 and the second conductive part L2 may be conductors with electrical conductivity.

Figure 3:
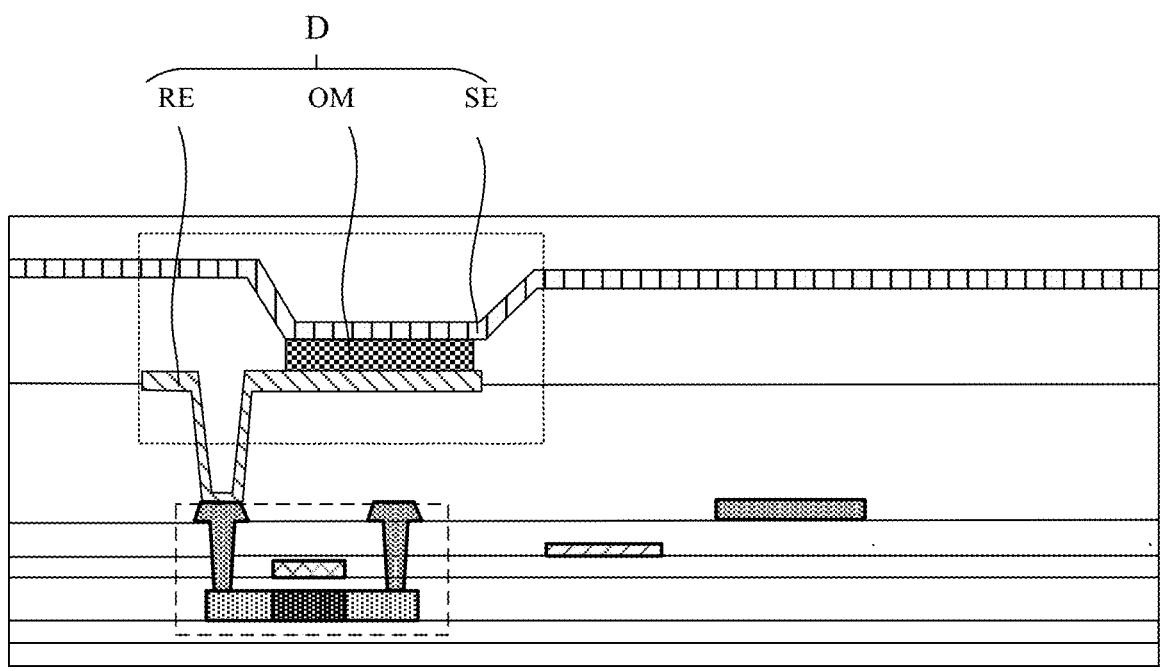
FIG. 3 is a schematic cross section view of a portion of a display panel provided by the embodiments of the present application.

FIG. 3 is a schematic cross section view of a portion of a display panel provided by the embodiments of the present application. As shown in FIG. 3, for example, the light-emitting element D may be an organic light emitting diode (OLED), and the light-emitting element D includes a first electrode RE, a second electrode SE, and a light-emitting layer OM between the first electrode RE and the second electrode SE. The first electrode RE of the light-emitting element D may be an anode of the light-emitting element D, and the second electrode SE of the light-emitting element D may be a cathode of the light-emitting element D.

In the embodiments of the present application, the first conductive part L1 may be electrically connected to the first electrode RE of the first-color light-emitting element D1, and the second conductive part L2 may be electrically connected to the first electrode RE of the second-color light-emitting element D2.

The first scan signal line SN may be overlapped with and insulated from the conductive parts L. For example, the first scan signal line SN may be overlapped with and insulated from the first conductive part L1, that is, a coupling capacitor (or parasitic capacitor) may be generated between the first scan signal line SN and the first conductive part L1. Similarly, the first scan signal line SN may be overlapped with and insulated from the second conductive part L2, that is, a coupling capacitor may be generated between the first scan signal line SN and the second conductive part L2.

In the embodiments of the present application, an overlapping area of the first scan signal line SN and the first conductive part L1 is larger than an overlapping area of the first scan signal line SN and the second conductive part L2, so that the capacitance of the coupling capacitor C1 generated between the first scan signal line SN and the first conductive part L1 is larger than the capacitance of the coupling capacitor C2 generated between the first scan signal line SN and the second conductive part L2.

As mentioned above, the capacitances of the equivalent capacitors (e.g., an equivalent capacitor C0 shown in FIG. 6) of light-emitting elements of different colors are different. The inventors of the present application have found that, under a condition that the coupling capacitor connected to the first-color light-emitting element is the same as the coupling capacitor connected to the second-color light-emitting element, and when a scan signal output by the first scan signal line SN is switched from a low level to a high level (that is, when jumping to high level), an influence of the coupling capacitor on a potential jump change of an electrode of the first-color light-emitting element is different from an influence of the coupling capacitor on a potential jump change of an electrode of the second-color light-emitting element. Under a condition that the capacitance of the equivalent capacitor of the first-color light-emitting element is greater than the capacitance of the equivalent capacitor of the second-color light-emitting element, the influence of the coupling capacitor on the potential jump change of the electrode of the second-color light-emitting element is greater, and a brightness rise effect of the second-color light-emitting element D2 is more obvious, and a brightness rise effect of the first-color light-emitting element by the coupling capacitor is less obvious. As a result, the difference between the brightness of the first-color light-emitting element and the brightness of the second-color light-emitting element is increased, and the color cast problem occurs.

In the embodiments of the present application, since the capacitance of the coupling capacitor C1 is larger than the capacitance of the coupling capacitor C2, and the first conductive part L1 is electrically connected to the first-color light-emitting element D1, and the second conductive part L2 is electrically connected to the second-color light-emitting element D2, when the scan signal output by the first scan signal line SN is switched from a low level to a high level, a potential rise degree of the first electrode of the first-color light-emitting element D1 by the coupling capacitor C1 can be increased, or a potential rise degree of the first electrode of the second-color light-emitting element D2 by the coupling capacitor C2 can be reduced. Thus, a difference between the brightness rise degree of the first-color light-emitting element D1 and the brightness rise degree of the second-color light-emitting element D2 is improved, and the color cast problem is improved.

According to some embodiments of the present application, alternatively, the first-color light-emitting element D1 may be a blue-light-emitting element, and the second-color light-emitting element D2 may be a red-light-emitting element.

The capacitance of the equivalent capacitor of the blue-light-emitting element is generally greater than the capacitance of the equivalent capacitor of the red-light-emitting element or the capacitance of the equivalent capacitor of a green-light-emitting element. In this way, since the capacitance of the coupling capacitor C1 is larger than the capacitance of the coupling capacitor C2, when the scan signal output by the first scan signal line SN is switched from a low level to a high level, the potential rise degree of the first electrode of the blue-light-emitting element by the coupling capacitor C1 is greater than the potential rise degree of the first electrode of the red-light-emitting element by the coupling capacitor C2. Thus, the brightness rise degree of the blue-light-emitting element is increased, and the difference between the brightness rise degree of the blue-light-emitting element and the brightness rise degree of the red-light-emitting element is improved, and the color cast problem is improved.

According to other embodiments of the present application, alternatively, the first-color light-emitting element D1 may be a blue-light-emitting element, and the second-color light-emitting element D2 may be a green-light-emitting element.

In this way, since the capacitance of the coupling capacitor C1 is larger than the capacitance of the coupling capacitor C2, when the scan signal output by the first scan signal line SN is switched from a low level to a high level, the potential rise degree of the first electrode of the blue-light-emitting element by the coupling capacitor C1 is greater than the potential rise degree of the first electrode of the green-light-emitting element by the coupling capacitor C2. Thus, the brightness rise degree of the blue-light-emitting element is increased, and the difference between the brightness rise degree of the blue-light-emitting element and the brightness rise degree of the green-light-emitting element is improved, and the color cast problem is improved.

According to further embodiments of the present application, alternatively, the first-color light-emitting element D1 may be a green-light-emitting element, and the second-color light-emitting element D2 may be a red-light-emitting element.

The capacitance of the equivalent capacitor of the green-light-emitting element is generally greater than or equal to the capacitance of the equivalent capacitor of the red-light-emitting element. In this way, since the capacitance of the coupling capacitor C1 is larger than the capacitance of the coupling capacitor C2, when the scan signal output by the first scan signal line SN is switched from a low level to a high level, the potential rise degree of the first electrode of the green-light-emitting element by the coupling capacitor C1 is greater than the potential rise degree of the first electrode of the red-light-emitting element by the coupling capacitor C2. Thus, the brightness rise degree of the green-light-emitting element is increased, and the difference between the brightness rise degree of the green-light-emitting element and the brightness rise degree of the red-light-emitting element is improved, and the color cast problem is improved.

As mentioned above, the parasitic capacitor causes a more obvious brightness rise effect for a light-emitting element D with a smaller capacitance of the equivalent capacitor thereof, and causes a less obvious brightness rise effect for a light-emitting element D with a greater capacitance of the equivalent capacitor thereof. Therefore, in some embodiments, alternatively, the capacitance of the first-color light-emitting element D1 may be greater than the capacitance of the second-color light-emitting element D2, that is, the capacitance of the equivalent capacitor of the first-color light-emitting element D1 may be greater than the capacitance of the equivalent capacitor of the second-color light-emitting element D2.

In this way, by improving the brightness rise effect of the first-color light-emitting element D1 with a greater the capacitance of equivalent capacitor thereof, the difference between the brightness rise degree of the first-color light-emitting element D1 and the brightness rise degree of the second-color light-emitting element D2 can be improved. In this way, the brightness rise degrees of the light-emitting elements of different colors are equal or approximate to one another, and the color cast problem is well improved.

Figure 4:
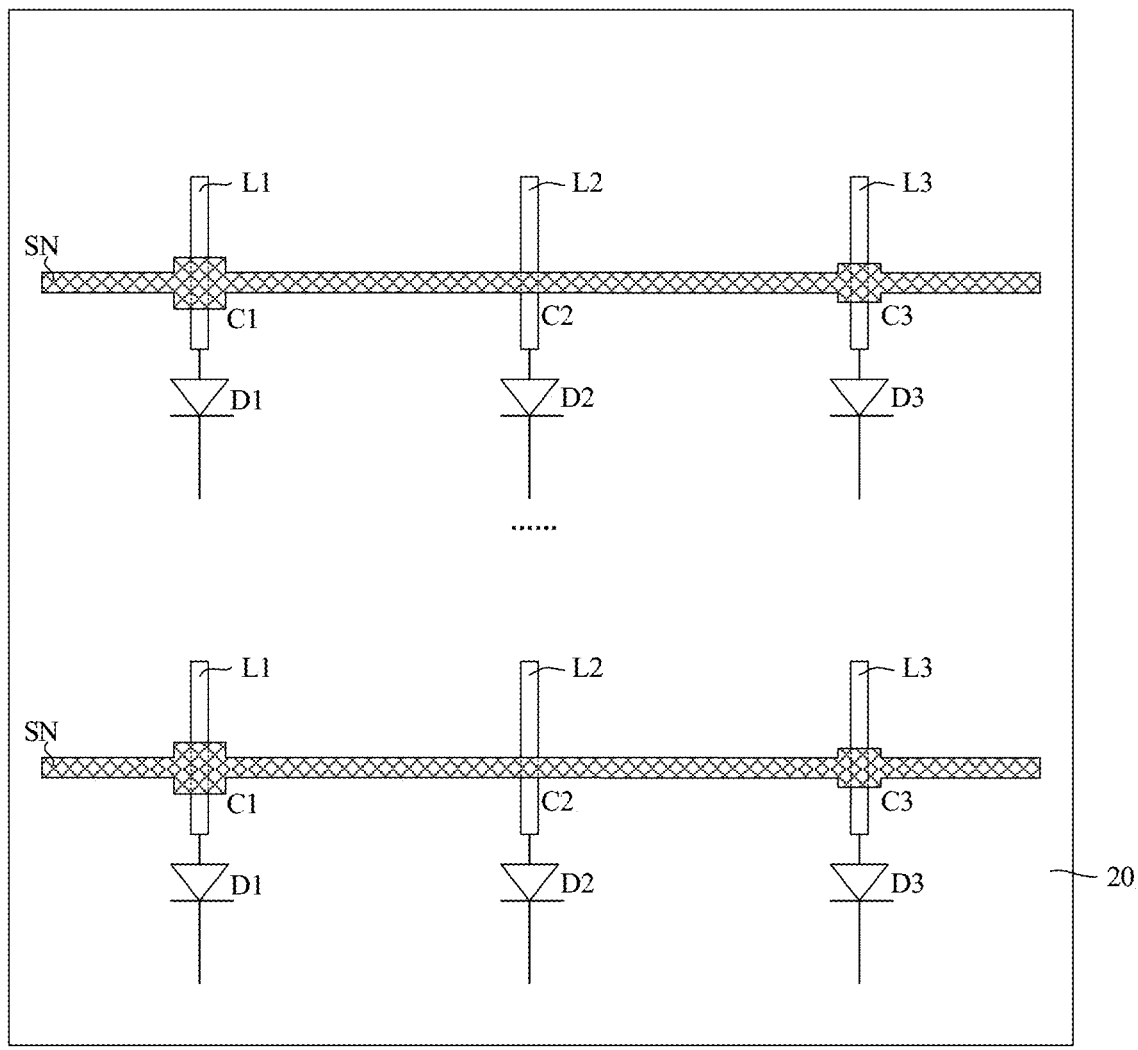
FIG. 4 is another schematic structure diagram of a portion of a display panel provided by the embodiments of the present application.

FIG. 4 is another schematic structure diagram of a portion of a display panel provided by the embodiments of the present application. As shown in FIG. 4, according to some embodiments of the present application, the display panel 20 may further include a third-color light-emitting element D3, the conductive parts L may further include a third conductive part L3, and the third conductive part L3 may be electrically connected to the third-color light-emitting element D3. Exemplarily, the third conductive part L3 may be a conductor with electrical conductivity. The third conductive part L3 may be electrically connected to the first electrode RE of the third-color light-emitting element D3.

The first scan signal line SN may be overlapped with and insulated from the third conductive part L3, that is, a coupling capacitor C3 may be generated between the first scan signal line SN and the third conductive part L3. Further, an overlapping area of the first scan signal line SN and the first conductive part L1 may be larger than an overlapping area of the first scan signal line SN and the third conductive part L3, and the overlapping area of the first scan signal line SN and the third conductive part L3 may be larger than or equal to the overlapping area of the first scan signal line SN and the second conductive part L2. In other words, the capacitance of the coupling capacitor C1>the capacitance of the coupling capacitor C3≥the capacitance of the coupling capacitor C2.

In this way, since the capacitance of the coupling capacitor C1>the capacitance of the coupling capacitor C3≥the capacitance of the coupling capacitor C2, and the first conductive part L1 is electrically connected to the first-color light-emitting element D1, the second conductive part L2 is electrically connected to the second-color light-emitting element D2, and the third conductive part L3 may be electrically connected to the third-color light-emitting element D3, when the scan signal output by the first scan signal line SN is switched from a low level to a high level, the potential rise degree of the first electrode of the first-color light-emitting element D1 by the coupling capacitor C1 is greater than the potential rise degree of the first electrode of the third-color light-emitting element D3 by the coupling capacitor C3, and the potential rise degree of the first electrode of the third-color light-emitting element D3 by the coupling capacitor C3 is greater than or equal to the potential rise degree of the first electrode of the second-color light-emitting element D2 by the coupling capacitor C2. Thus, a difference among the brightness rise degree of the first-color light-emitting element D1, the brightness rise degree of the second-color light-emitting element D2 and the brightness rise degree of the third-color light-emitting element D3 is improved, and the color cast problem is improved.

In some specific embodiments, for example, the capacitance of the equivalent capacitor of the first-color light-emitting element D1>the capacitance of the equivalent capacitor of the third-color light-emitting element D3>the capacitance of the equivalent capacitor of the second-color light-emitting element D2. Correspondingly, the overlapping area of the first scan signal line SN and the first conductive part L1>the overlapping area of the first scan signal line SN and the third conductive part L3>the overlapping area of the first scan signal line SN and the second conductive part L2, such that the capacitance of the coupling capacitor C1>the capacitance of the coupling capacitor C3>the capacitance of the coupling capacitor C2. In this way, it is possible that the brightness rise degree of the first-color light-emitting element D1>the brightness rise degree of the third-color light-emitting element D3>the brightness rise degree of the second-color light-emitting element D2, and thus the difference among the brightness of the first-color light-emitting element D1, the brightness of the second-color light-emitting element D2, and the brightness of the third-color light-emitting element D3 is improved, and the color cast problem is improved.

In some specific embodiments, alternatively, the first-color light-emitting element D1 may be a blue-light-emitting element, the second-color light-emitting element D2 may be a green-light-emitting element, and the third-color light-emitting element D3 may be a red-light-emitting element.

The capacitance of the equivalent capacitor of the blue-light-emitting element is generally greater than the capacitance of the equivalent capacitor of the red-light-emitting element or the capacitance of the equivalent capacitor of the green-light-emitting element. In this way, since the capacitance of the coupling capacitor C1>the capacitance of the coupling capacitor C3≥the capacitance of the coupling capacitor C2, when the scan signal output by the first scan signal line SN is switched from a low level to a high level, the potential rise degree of the first electrode of the blue-light-emitting element by the coupling capacitor C1 is greater than the potential rise degree of the first electrode of the green-light-emitting element by the coupling capacitor C3, the potential rise degree of the first electrode of the green-light-emitting element by the coupling capacitor C3 is greater than or equal to the potential rise degree of the first electrode of the red-light-emitting element by the coupling capacitor C2. Thus, the difference among the brightness rise degree of the blue-light-emitting element, the brightness rise degree of the green-light-emitting element and the brightness rise degree of the red-light-emitting element is improved, and the color cast problem is improved.

Figure 5:
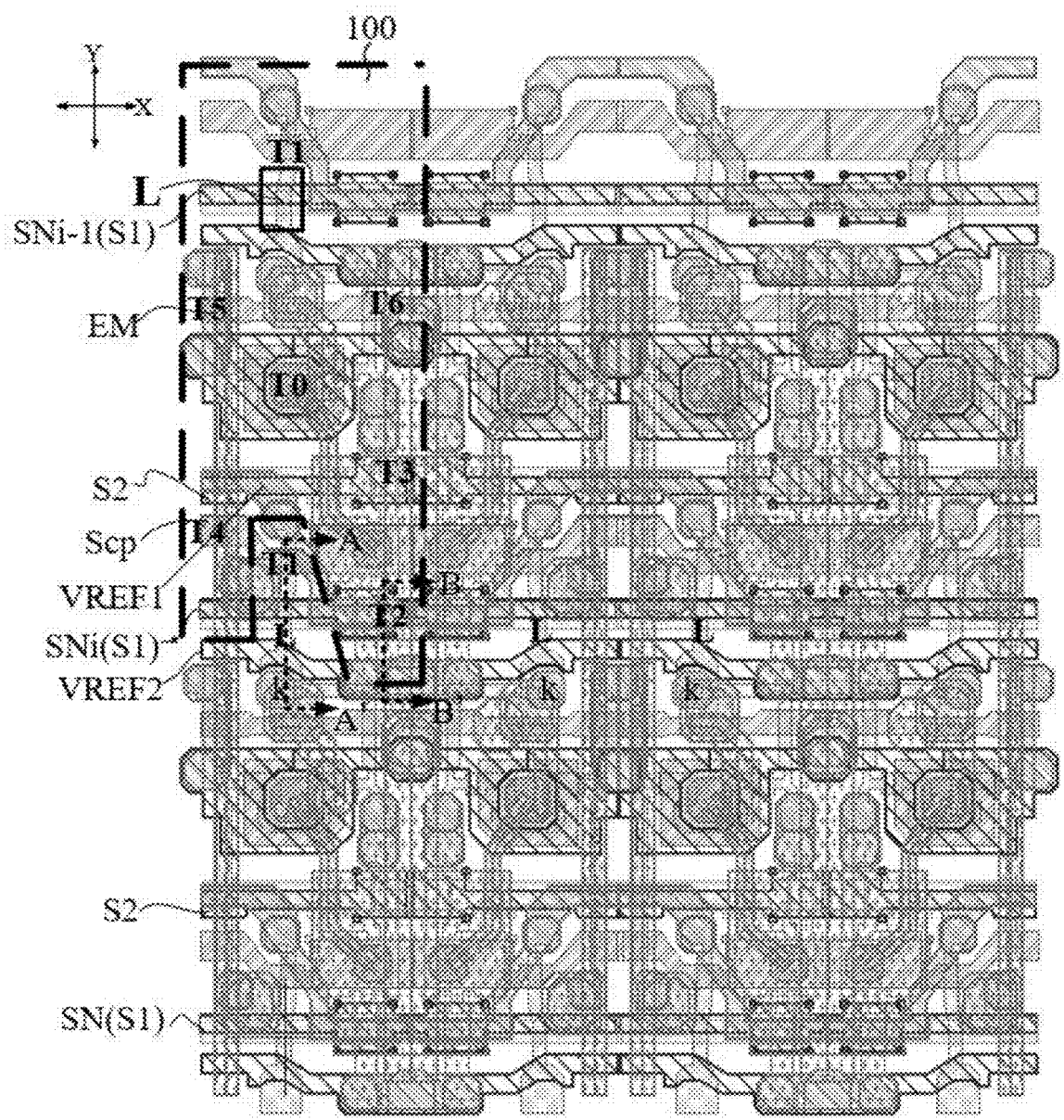
FIG. 5 is a layout diagram of a portion of a display panel provided by the embodiments of the present application.
Figure 6:
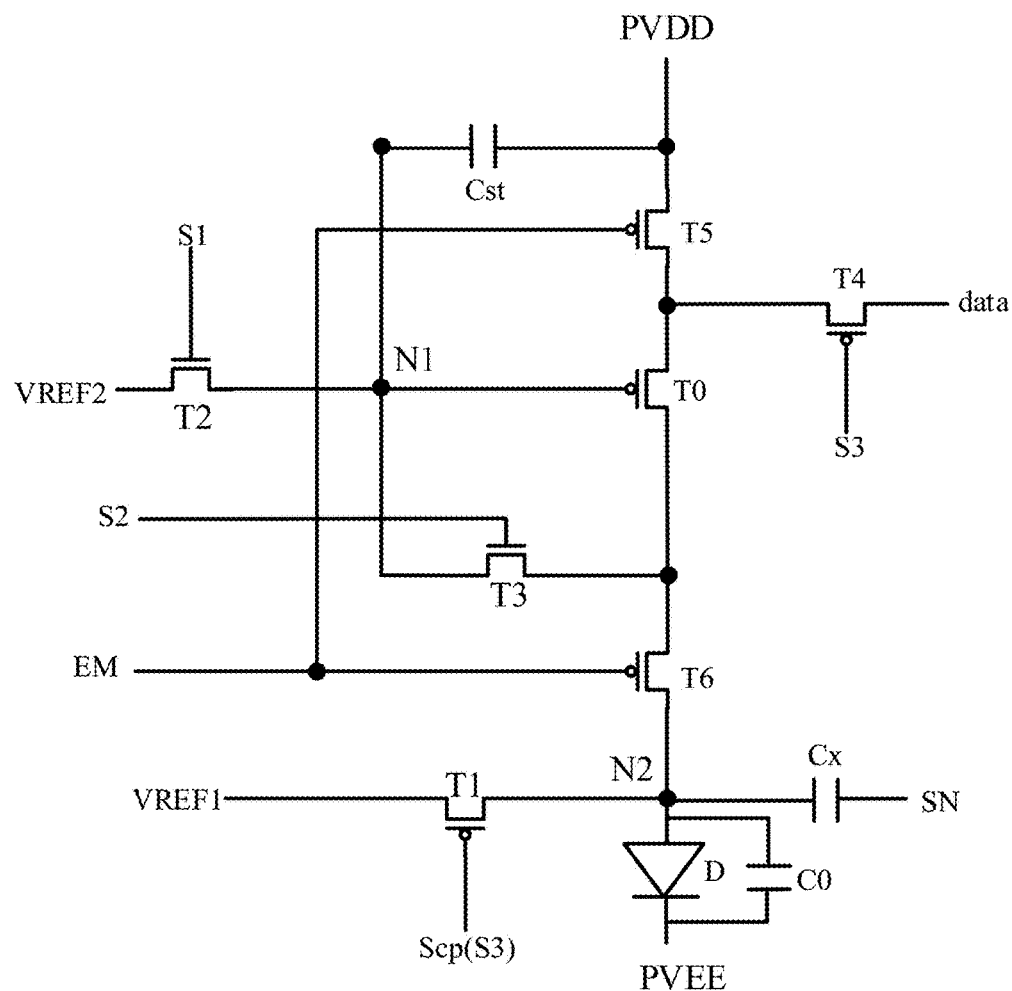
FIG. 6 is a schematic circuit diagram of a pixel circuit in a display panel provided by the embodiments of the present application.

FIG. 5 is a layout diagram of a portion of a display panel provided by the embodiments of the present application. FIG. 6 is a schematic circuit diagram of a pixel circuit in a display panel provided by the embodiments of the present application. As shown in FIG. 5 and FIG. 6, according to some embodiments of the present application, alternatively, the display panel 20 may further include a pixel circuit 100 and a first reference voltage signal line VREF1. It should be noted that FIG. 5 and FIG. 6 are illustrated by taking that the pixel circuit 100 is a 7T1C pixel circuit as an example, but it can be understood that the pixel circuit 100 may further be a pixel circuit of other type other than 7T1C pixel circuit, such as a 7T2C pixel circuit, a 8T1C pixel circuit or a 9T1C pixel circuit, etc. Among them, the 7T1C pixel circuit is a pixel circuit including 7 thin film transistors (TFT) and 1 storage capacitor Cst, and the 7T2C pixel circuit is a pixel circuit including 7 TFTs and 2 storage capacitors Cst, and so on, which will not be repeated here.

As shown in FIG. 5 and FIG. 6, the pixel circuit 100 may include a first transistor T1, and the first transistor T1 may be electrically connected to the light-emitting element D through the conductive part L. The first reference voltage signal line VREF1 may be electrically connected to the first transistor T1. In particular, the gate of the first transistor T1 may be electrically connected to the scan signal line Scp, the first electrode of the first transistor T1 may be electrically connected to the first reference voltage signal line VREF1, and the second electrode of the first transistor T1 may be electrically connected to the first electrode of the light-emitting element D through the conductive part L and a via k. The first transistor T1 may be turned on under the control of a scan signal provided by the scan signal line Scp, to transmit a first reference voltage signal of the first reference voltage signal line VREF1 to the first electrode of the light-emitting element D, so as to reset the first electrode of the light-emitting element D.

In this way, by reusing the wiring between the first transistor T1 and the light-emitting element D as the conductive part L, a process for additionally adding the conductive part L may be eliminated, which is beneficial to simplify process, save wiring space, and reduce manufacture cost.

As shown in FIG. 5 and FIG. 6, the overlapping of the conductive part L and the first scan signal line SN may form a coupling capacitor Cx. The coupling capacitor Cx may include the coupling capacitor C1, the coupling capacitor C2, or the coupling capacitor C3 described above. A first electrode plate of the coupling capacitor Cx may be regarded as being electrically connected to the first scan signal line SN (i.e., the first scan signal line SN is reused), and a second electrode plate of the coupling capacitor Cx may be electrically connected to a second node N2. The second node N2 is a node electrically connected to the first electrode of the light-emitting element D. In some embodiments, for example, the first scan signal line SN may particularly be the scan signal line S1 that controls the turn-on/turn-off of the second transistor T2.

Figure 7:
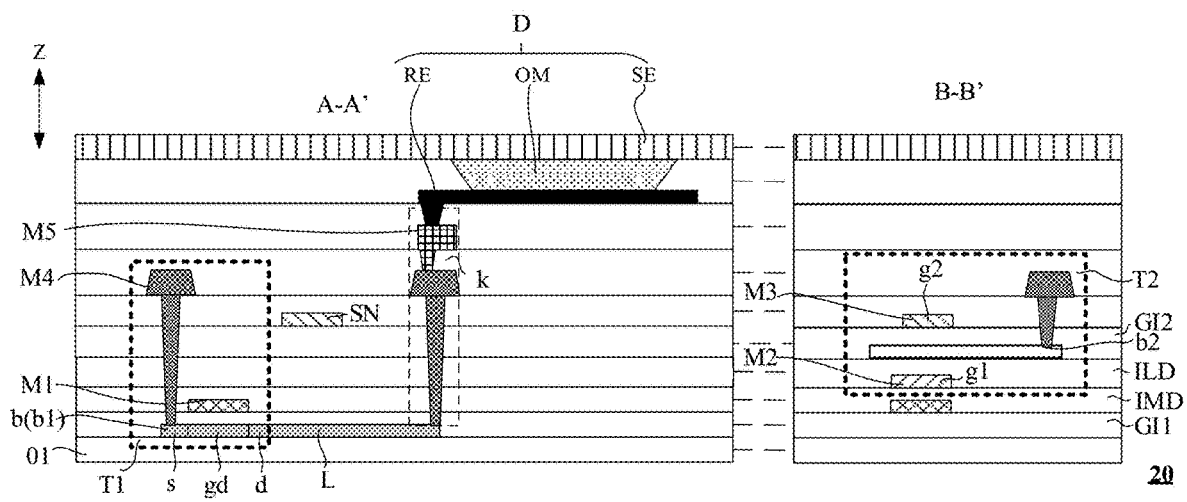
FIG. 7 is a schematic cross section view in a A-A' direction and a B-B' direction in FIG. 5.

FIG. 7 is a schematic cross section view in a A-A' direction and a B-B' direction in FIG. 5. As shown in FIG. 5 and FIG. 7, according to some embodiments of the present application, alternatively, the first transistor T1 may include an active layer b, and the conductive part L and the active layer b may be arranged in a same layer. Exemplarily, the material of the active layer b may be a polysilicon material. The polysilicon material may be particularly formed by using a low-temperature amorphous silicon technology, for example, the polysilicon material is formed by melting amorphous silicon material by laser, which is not limited in the embodiments of the present application.

As shown in FIG. 5, a wiring space where the conductive part L is arranged is very small. If the conductive part L is arranged in a film layer different from that of the active layer b, the active layer of the first transistor T1 needs to be connected to the conductive part L through an additionally arranged via, and the via needs to occupy a certain space. Thus, if the via for connecting the active layer b of the first transistor T1 and the conductive part L, other patterns (e.g., the first scan signal line SNi) needs to keep away from the position of the via, which increases the layout area of the pixel circuit and is not conducive to improving the PPI of the display panel. However, in the embodiments of the present application, by arranging the conductive part L in the film layer where the active layer b is arranged, it is not necessary to further apply a drilling process, and at the same time, an occupation of the wiring space may be reduced.

In addition, a plurality of insulating layers are generally sandwiched between the source/drain and the active layer of each transistor, the source/drain of the transistor is generally electrically connected to the corresponding active layer through via penetrating through the respective insulating layers, and the source and drain are generally arranged in a same layer, so that the source and drain may be manufactured simultaneously, which simplifies the process. In addition, for the transistor of which the active layer contains polysilicon, in order to make the source/drain and the active layer have a good electrical contact characteristic, after vias are formed in the respective insulating layers and before the manufacturing of the source/drain, a hydrofluoric acid cleaning needs to be performed on portions of the active layer exposed by the vias. It can be seen that if the conductive part is arranged in a film layer different from the film layers where the active layer and the source/drain are arranged, it is necessary to separately arranged vias for implementing a connection between the conductive part and the active layer of the transistor, to add a process such as a hydrofluoric acid cleaning, and it needs additional masks for patterning the respective insulating layers to form the vias, and increases the manufacturing cost and further reduces the manufacturing yield of the display panel.

However, in the embodiments of the present application, by arranging the conductive part L in the film layer where the active layer b is arranged, a series of processes involved in separately arranging the conductive part may be avoided, which is beneficial to simplify manufacture process.

In addition, if the conductive part is arranged in the film layer where the source/drain of each transistor is arranged, since the first reference voltage signal line VREF1 connected to one terminal of the first transistor T1 is arranged in the film layer where the source/drain is arranged (e.g., a fourth metal layer M4 as shown in FIG. 7), and an extension direction of the first reference voltage signal line VREF1 is deflected toward the other terminal of the first transistor T1, there is not enough space at the other terminal of the first transistor T1 to arrange a conductive part to be located in a same layer with the first reference voltage signal line VREF1, which increases the wiring difficulty and the risk of short circuit. In the embodiments of the present application, by arranging the conductive part L in the film layer where the active layer b is arranged, on the one hand, there is no need to additionally arrange a via for connecting the active layer b of the first transistor T1 and the conductive part L, and on the other hand, the wiring difficulty is reduced, and a problem of short circuit between the two terminals of the first transistor T1 is avoided.

On another hand, since the first scan signal line SN is generally arranged in a metal layer over the film layer where the active layer b is arranged, and a distance between the film layer where the active layer b is arranged and the metal layer is relatedly large, the capacitance of the coupling capacitor generated between the conductive part L and the first scan signal line SN can be reduced. Thus, an influence on the brightness rise of the light-emitting element by the coupling capacitor is reduced, the difference among the brightness rise degrees of the light-emitting elements of different colors is further improved, and the color cast problem is well improved.

As shown in FIG. 5 and FIG. 7, according to some embodiments of the present application, alternatively, the conductive part L may be formed by an extension part of the active layer b. For example, the conductive part L is formed by extending the active layer b in the second direction Y.

In this way, since the conductive part L is formed by the extension part of the active layer b, there is no need of an additional bridge connection between the conductive part L and the active layer b, which is beneficial to simplify wiring. Further, the conductive part L and the active layer b may be manufactured by a same process, which is beneficial to simplify the manufacture process and reduce the manufacture cost.

The active layer b of the transistor may include a channel region gd and a source region s and a drain region d on opposite sides of the channel region gd, respectively. The source region s and the drain region d may be obtained by doping ion impurity into the semiconductor material, and the channel region gd maintains semiconductor characteristic.

The conductive part L may be formed by an extension part the source region s or the drain region d of the active layer b, that is, the conductive part L has conductivity.

As shown in FIG. 5 to FIG. 7, according to some embodiments of the present application, alternatively, the pixel circuit 100 may further include a second transistor T2. The first transistor T1 may include a first active layer b1. The material of the first active layer b1 may include silicon. Exemplarily, the material of the first active layer b may be a polysilicon material. The polysilicon material may be particularly formed by using a low-temperature amorphous silicon technology, for example, the polysilicon material is formed by melting amorphous silicon material by laser, which is not limited in the embodiments of the present application.

The second transistor T2 may include a second active layer b2 and a second gate g2, and the material of the second active layer b2 may include a metal oxide, such as an indium gallium zinc oxide. In a direction Z perpendicular to a plane where the display panel is located, the film layer where the second active layer b2 is arranged may be between the film layer where the second gate g2 is arranged and the film layer where the first active layer b1 is arranged. The second transistor T2 may further include a first gate g1, and in the direction Z perpendicular to the plane where the display panel is located, a film layer where the first gate g1 is arranged may be between the film layer where the first active layer b1 is arranged and the film layer where the second active layer b2 is arranged.

The conductive part L and the first active layer b1 may be arranged in a same layer, and the first scan signal line SN may include the second gate g2, that is, the first scan signal line SN extends in the first direction X, and includes a portion overlapped with the second active layer b2 of the second transistor T2. The portion of the first scan signal line SN which is overlapped with the second active layer b2 may serve as the second gate g2.

In this way, by arranging the conductive part L in the film layer where the active layer b is arranged, and arranging the first scan signal line SN in the film layer where the second gate g2 of the second transistor is arranged, between the conductive part L and the first scan signal line SN, there may be an insulating layer between the first active layer b1 and a first metal layer M1, an insulating layer between the first metal layer M1 and a second metal layer M2, an insulating layer between the second metal layer M2 and the second active layer b2, and an insulating layer between the second active layer b2 and a third metal layer M3. Since a distance between the film layer where the active layer b is arranged and the film layer where the second gate g2 of the second transistor is arranged is relatedly large, the capacitance of the coupling capacitor generated between the conductive part L and the first scan signal line SN may be reduced. Thus, the influence on the brightness rise of the light-emitting element by the coupling capacitor is reduced, the difference among the brightness rise degrees of the light-emitting elements of different colors is further improved, the brightness rise degrees of the light-emitting elements of different colors are equal or approximate to one another, and the color cast problem is well improved.

As shown in FIG. 7, according to some embodiments of the present application, alternatively, the display panel 20 may include a substrate 01 and the first active layer b1, the first metal layer M1, the second metal layer M2, the second active layer b2, the third metal layer M3, the fourth metal layer M4, a fifth metal layer M5 and an electrode layer RE which are arranged over the substrate 01 and stacked in sequence. The conductive parts L and the first active layer b1 may be arranged in a same layer, and the first scan signal line SN may be arranged in the third metal layer M3. Exemplarily, the substrate 01 may include a rigid substrate such as a glass, a metal foil, etc., or may include a flexible substrate made of material such as a polyimide (PI), a polycarbonate (PC), a polystyrene (PS), a polyethylene (PE), a polyvinyl chloride (PV), a polyvinylpyrrolidone (PVP), a polyethylene terephthalate (PET) or other similar materials, and the substrate 01 has a main function of supporting.

It should be noted that the dotted lines between the schematic cross section view of A-A' and the schematic cross section view of B-B' is used for illustrating a corresponding relationship among the film layers in the two schematic cross section views.

It is easy to understand that the display panel 20 is provided with electronic devices such as thin film transistors and capacitors. In some specific embodiments, for example, at least one of the gates of the thin film transistors and at least one of the first electrode plates of the capacitors may be arranged in the first metal layer M1, at least one of the second electrode plates of the capacitors may be arranged in the second metal layer M2, and at least one of sources and drains of the thin film transistors may be arranged in the fourth metal layer M4.

In some specific embodiments, both the fourth metal layer M4 and the fifth metal layer M5 may be used for arranging power supply signal line, such as a first power supply signal line PVDD or a second power supply signal line PVEE. An extending direction of the power supply signal line in the fourth metal layer M4 intersects with an extending direction of the power supply signal line in the fifth metal layer M5, and the power supply signal line in the fourth metal layer M4 may be electrically connected to the power supply signal line in the fifth metal layer M5 through a via, so that the power supply signal lines form meshed traces to reduce a IR-drop of the power supply signal lines.

In this way, by arranging the conductive part L in the film layer where the first active layer b1 is arranged, and arranging the first scan signal line SN in the third metal layer M3, since a distance between the film layer where the first active layer b1 is arranged and the third metal layer M3 is relatedly large, the capacitance of the coupling capacitor generated between the conductive part L and the first scan signal line SN can be reduced. Thus, an influence on the brightness rise of the light-emitting element by the coupling capacitor is reduced, the difference among the brightness rise degrees of the light-emitting elements of different colors is further improved, the brightness rise degrees of the light-emitting elements of different colors are equal or approximate to one another, and the color cast problem is well improved.

In other embodiments, the first scan signal line SN may be arranged in the second metal layer M2, which is not limited in the embodiments of the present application.

It should be noted that the number of metal layers shown in FIG. 7 is only for illustration. In other embodiments, the display panel 20 may include three metal layers, four metal layers, or other numbers of metal layers, which is not limited in the embodiments of the present application.

As shown in FIG. 7, according to some embodiments of the present application, alternatively, the display panel 20 may include a first insulating layer GI1, a second insulating layer IMD, a third insulating layer ILD and a fourth insulating layer GI2. The first insulating layer GI1 is between the film layer where the first active layer b1 is arranged and the first metal layer M1. The second insulating layer IMD is between the first metal layer M1 and the second metal layer M2. The third insulating layer ILD is between the second metal layer M2 and the film layer where the second active layer b2 is arranged. The fourth insulating layer GI2 is between the film layer where the second active layer b2 is arranged and the third metal layer M3.

It should be noted that, other unlisted insulating layers may further be sandwiched between the first scan signal line SN and the conductive part L, which is not limited in the embodiments of the present application.

According to some embodiments of the present application, alternatively, the insulating layers between the first scan signal line SN and the conductive parts L may have a total thickness greater than 2000 angstroms and smaller than 10000 angstroms.

The reason of selecting the above-mentioned thickness range of 2000-10000 angstroms in some embodiments of the present application is that: the inventors of the present application have found that if the total thickness of the insulating layers between the first scan signal line SN and the conductive part L is too small, for example, smaller than 2000 angstroms, the capacitance of the coupling capacitor generated between the conductive part L and the first scan signal line SN may be too large, which will cause a great influence on the brightness rise of the light-emitting element by the coupling capacitor, and which is not beneficial to improve the difference among the brightness rise degrees of light-emitting elements of different colors. If the total thickness of the insulating layers between the first scan signal line SN and the conductive part L is too large, for example, greater than 10,000 angstroms, a thickness of the manufactured display panel will be relatively large, and the manufacture cost will be high, which is not beneficial to the slim and lightweight design of the display panel.

Therefore, selecting the thickness range of 2000-10000 angstroms may better improve the difference among the brightness rise degrees of light-emitting elements of different colors, and at the same time, it is beneficial to the slim and lightweight design of the display panel.

Return to refer to FIG. 5, according to some embodiments of the present application, alternatively, the first scan signal line SN may extend in the first direction X. For two pixel circuits 100 adjacent in the second direction Y, the first scan signal line SN may provide a signal to one of the two pixel circuits 100, and overlaps with a conductive part L electrically connected to the other of the two pixel circuits 100. The first direction X and the second direction Y intersect with each other. Exemplarily, the first direction X may be perpendicular to the second direction Y For example, the first direction X may be a row direction of the display panel, and the second direction Y may be a column direction of the display panel.

In particular, the display panel 20 may include a plurality of first scan signal lines SN extending in the first direction X and arranged and spaced apart from one another in the second direction Y, and a plurality rows of pixel circuits 100, and pixel circuits 100 of a same row are between any two adjacent first scan signal lines SN.

A $i^{th}$ first scan signal line SNi may be electrically connected to the pixel circuits 100 of the $i^{th}$ row, and the $i^{th}$ first scan signal line SNi may provide a scan signal to the pixel circuits 100 of the $i^{th}$ row, wherein the i is a positive integer. For example, the $1^{st}$ scan signal line SN may be electrically connected to the pixel circuits 100 of the $1^{st}$ row. The $2^{nd}$ first scan signal line SN may be electrically connected to the pixel circuits 100 of the $2^{nd}$ row, and so on.

The $i^{th}$ first scan signal line SNi may be overlapped with the conductive parts L electrically connected to the pixel circuits 100 of the (i+1)$^{th}$ row. That is, the first scan signal line SN connected to the pixel circuits 100 of the current row may overlap with the first conductive parts L1 and the second conductive parts L2 in the pixel circuits 100 of the next row to form coupling capacitors. The overlapping area of the i$^{th}$ first scan signal line SNi and a first conductive part L1 in a pixel circuit 100 of the (i+1)$^{th}$ row may be larger than the overlapping area of the i$^{th}$ first scan signal line SNi and a second conductive part L2 in a pixel circuit 100 of the (i+1)$^{th}$ row, so that the capacitance of the coupling capacitor C1 generated between the first scan signal line SN and the first conductive part L1 is greater than the capacitance of the coupling capacitor C2 generated between the first scan signal line SN and the second conductive part L2, thereby improving the color cast problem.

In another embodiment, the i$^{th}$ first scan signal line SNi may be electrically connected to the pixel circuits 100 of the i$^{th}$ row, and overlapped with the conductive parts L electrically connected to the pixel circuits 100 of the i$^{th}$ row.

Figure 8:
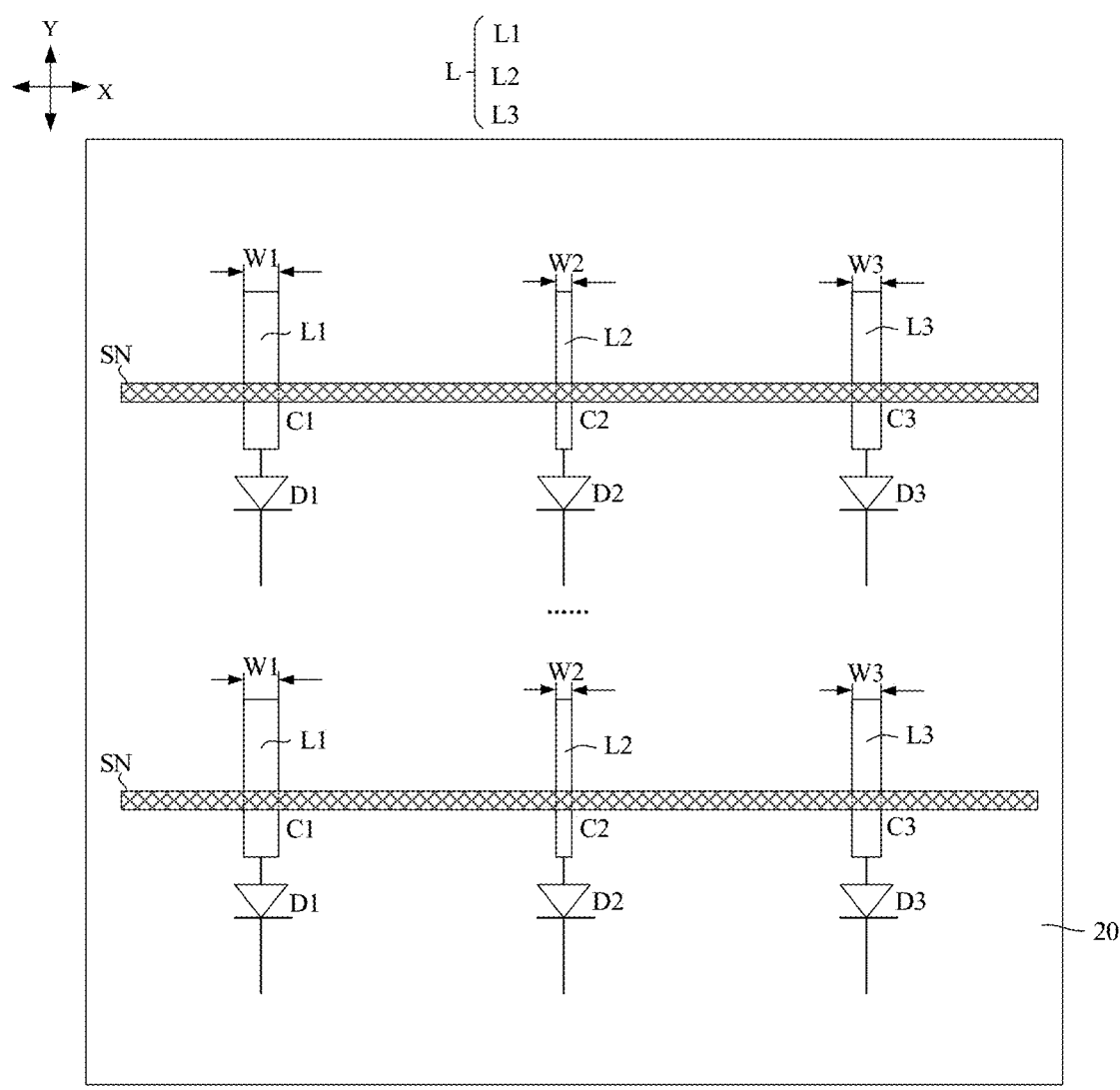
FIG. 8 is another schematic structure diagram of a portion of a display panel provided by the embodiments of the present application.

FIG. 8 is another schematic structure diagram of a portion of a display panel provided by the embodiments of the present application. As shown in FIG. 8, according to some embodiments of the present application, alternatively, the first scan signal line SN may extend in the first direction X, the conductive part L may extend in the second direction Y, and the first direction X and the second direction Y intersect with each other.

In the first direction X, a portion of the first conductive part L1 overlapped with the first scan signal line SN may have a width W1 greater than a width W2 of a portion of the second conductive part L2 overlapped with the first scan signal line SN.

In this way, by adjusting the widths of the conductive parts, the overlapping area of the first scan signal line SN and the first conductive part L1 is larger than the overlapping area of the first scan signal line SN and the second conductive part L2, so that the capacitance of the coupling capacitor C1 generated between the scan signal line SN and the first conductive part L1 is greater than the capacitance of the coupling capacitor C2 generated between the first scan signal line SN and the second conductive part L2, which may reduce an influence on the width of the first scan signal line SN. Since the capacitance of the coupling capacitor C1 is larger than the capacitance of the coupling capacitor C2, when the scan signal output by the first scan signal line SN is switched from a low level to a high level, the potential rise degree of the first electrode of the first-color light-emitting element D1 by the coupling capacitor C1 is greater than the potential rise degree of the first electrode of the second-color light-emitting element D2 by the coupling capacitor C2. Thus, the brightness rise degree of the first-color light-emitting element D1 is increased, and the difference between the brightness rise degree of the first-color light-emitting element D1 and the brightness rise degree of the second-color light-emitting element D2 is improved, and the color cast problem is improved.

Continuing to refer to FIG. 8, according to some embodiments of the present application, alternatively, in the first direction X, the width W1 of the portion of the first conductive part L1 overlapped with the first scan signal line SN may be greater than a width W3 of a portion of the third conductive part L3 overlapped with the first scan signal line SN, and the width W3 of the portion of the third conductive part L3 overlapped with the first scan signal line SN may be greater than or equal to the width W2 of a portion of the second conductive part L2 overlapped with the first scan signal line SN.

In this way, by adjusting the widths of the conductive parts, the overlapping area of the first scan signal line SN and the first conductive part L1>the overlapping area of the first scan signal line SN and the third conductive part L3>the overlapping area of the first scan signal line SN and the second conductive part L2, such that the capacitance of the coupling capacitor C1>the capacitance of the coupling capacitor C3>the capacitance of the coupling capacitor C2. In this way, it is possible that the brightness rise degree of the first-color light-emitting element D1>the brightness rise degree of the third-color light-emitting element D3>the brightness rise degree of the second-color light-emitting element D2, and thus a difference among the brightness of the first-color light-emitting element D1, the brightness of the second-color light-emitting element D2, and the brightness of the third-color light-emitting element D3 is improved, and the color cast problem is improved.

Figure 9:
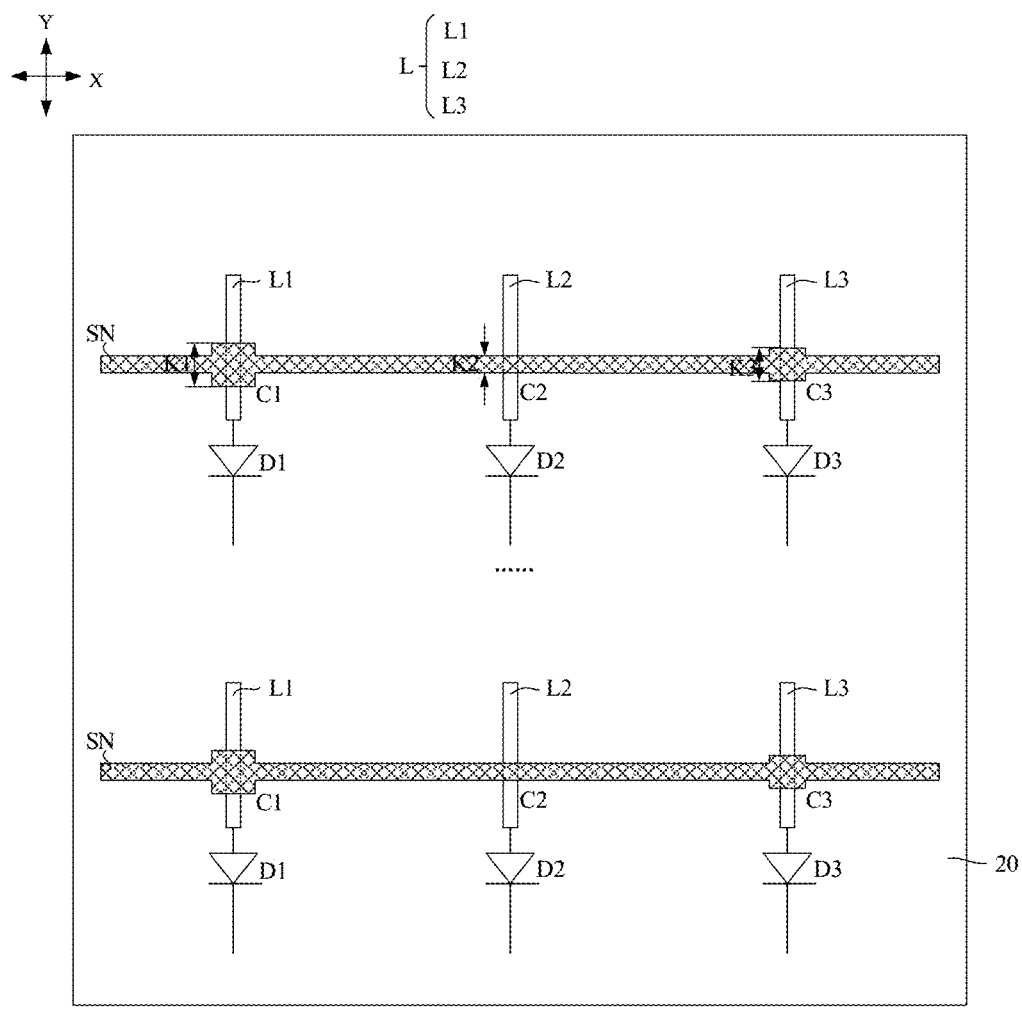
FIG. 9 is another schematic structure diagram of a portion of a display panel provided by the embodiments of the present application.

FIG. 9 is another schematic structure diagram of a portion of a display panel provided by the embodiments of the present application. As shown in FIG. 9, the embodiments of FIG. 9 different from the embodiments of FIG. 8 in that, according to other embodiments of the present application, alternatively, in the second direction Y, a portion of the first scan signal line SN overlapped with the first conductive part L1 may have a width K1 greater than a width K2 of a portion of the first scan signal line SN overlapped with the second conductive part L2.

In this way, by adjusting the width of first scan signal line SN, the overlapping area of the first scan signal line SN and the first conductive part L1 is larger than the overlapping area of the first scan signal line SN and the second conductive part L2, so that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is larger than the capacitance of the coupling capacitor C2, when the scan signal output by the first scan signal line SN is switched from a low level to a high level, the potential rise degree of the first electrode of the first-color light-emitting element D1 by the coupling capacitor C1 is greater than the potential rise degree of the first electrode of the second-color light-emitting element D2 by the coupling capacitor C2. Thus, the brightness rise degree of the first-color light-emitting element D1 is increased, and the difference between the brightness rise degree of the first-color light-emitting element D1 and the brightness rise degree of the second-color light-emitting element D2 is improved, and the color cast problem is improved.

Continuing to refer to FIG. 9. according to some embodiments of the present application, alternatively, in the second direction Y, the width K1 of the portion of the first scan signal line SN overlapped with the first conductive part L1 may be greater than a width K3 of a portion of the first scan signal line SN overlapped with the third conductive part L3, and the width K3 of the portion of the first scan signal line SN overlapped with the third conductive part L3 may be greater than or equal to the width K2 of the portion of the first scan signal line SN overlapped with the second conductive part L2.

In this way, by adjusting the width of the first scan signal line SN, the overlapping area of the first scan signal line SN and the first conductive part L1>the overlapping area of the first scan signal line SN and the third conductive part L3>the overlapping area of the first scan signal line SN and the second conductive part L2, such that the capacitance of the coupling capacitor C1>the capacitance of the coupling capacitor C3>the capacitance of the coupling capacitor C2. In this way, it is possible that the brightness rise degree of the first-color light-emitting element D1>the brightness rise degree of the third-color light-emitting element D3>the brightness rise degree of the second-color light-emitting element D2, and thus a difference among the brightness of the first-color light-emitting element D1, the brightness of the second-color light-emitting element D2, and the brightness of the third-color light-emitting element D3 is improved, and the color cast problem is improved.

Figure 10:
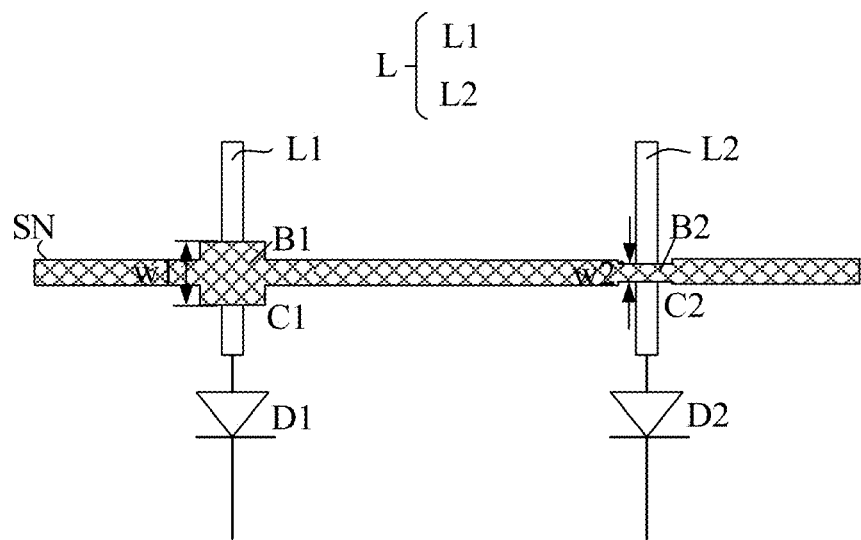
FIG. 10 is another schematic structure diagram of a portion of a display panel provided by the embodiments of the present application.

FIG. 10 is another schematic structure diagram of a portion of a display panel provided by the embodiments of the present application. As shown in FIG. 10, according to further embodiments of the present application, alternatively, the first scan signal line SN may include a first portion B1 having a first width w1' and a second portion B2 having a second width w2', and the first width w1' is greater than the second width w2'. The first portion B1 overlaps with the first conductive part L1, and the second portion B2 overlaps with the second conductive part L2. The first portion B1 may be a widened portion of the first scan signal line SN, or the second portion B2 may be a narrowed portion of the first scan signal line SN.

In this way, by a widened design of the first portion B1 of the first scan signal line SN, and/or a narrowed design of the second portion B2 of the first scan signal line SN, the overlapping area of the first scan signal line SN and the first conductive part L1 is larger than the overlapping area of the first scan signal line SN and the second conductive part L2, so that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is larger than the capacitance of the coupling capacitor C2, when the scan signal output by the first scan signal line SN is switched from a low level to a high level, the potential rise degree of the first electrode of the first-color light-emitting element D1 by the coupling capacitor C1 is greater than the potential rise degree of the first electrode of the second-color light-emitting element D2 by the coupling capacitor C2. Thus, the brightness rise degree of the first-color light-emitting element D1 is increased, and the difference between the brightness rise degree of the first-color light-emitting element D1 and the brightness rise degree of the second-color light-emitting element D2 is improved, and the color cast problem is improved.

The widened or narrowed refers to a result of comparing the width of the portion of the first scan signal line SN overlapped with the conductive part L with the width of other portions of the first scan signal line SN.

Figure 11:
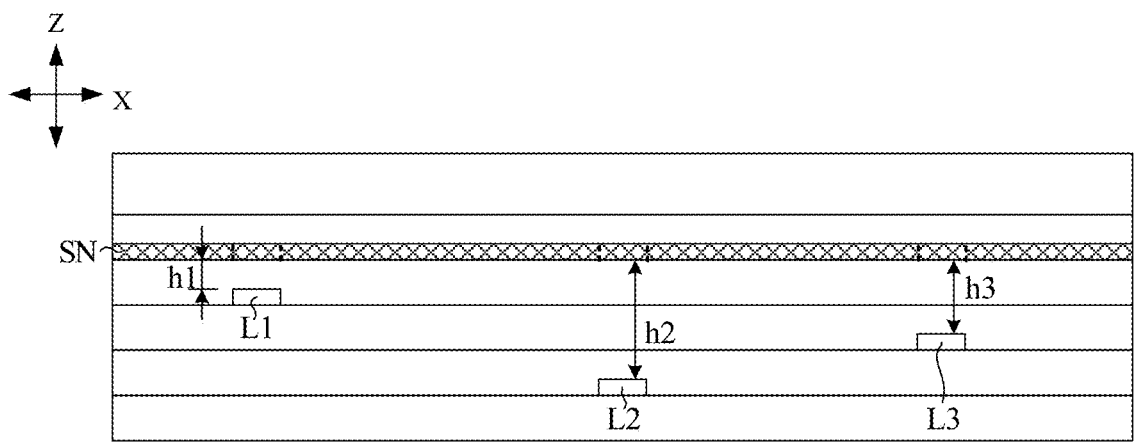
FIG. 11 is a schematic cross section view of a portion of a display panel provided by the embodiments of the present application.

FIG. 11 is a schematic cross section view of a portion of a display panel provided by the embodiments of the present application. As shown in FIG. 11, according to other embodiments of the present application, alternatively, in the direction Z perpendicular to the plane where the display panel is located, a distance h1 between the first conductive part L1 and the first scan signal line SN may be smaller than a distance h2 between the second conductive part L2 and the first scan signal line SN.

Since a magnitude of capacitance of a capacitor is negatively correlated with the distance between the two electrode plates of the capacitor, the smaller the distance between the two electrode plates is, the greater the capacitance will be. Therefore, by adjusting the distance h1 between the first scan signal line and the first conductive part to be smaller than the distance h2 between the first scan signal line and the second conductive part, it is possible that the capacitance of the coupling capacitor C1 generated between the scan signal line SN and the first conductive part L1 is greater than the capacitance of the coupling capacitor C2 generated between the first scan signal line SN and the second conductive part L2, and thus the difference between the brightness rise degree of the first-color light-emitting element D1 and the brightness rise degree of the second-color light-emitting element D2 is improved, and the color cast problem is improved.

Continuing to refer to FIG. 11, in some specific embodiments, alternatively, the distance h1 between the first conductive part L1 and the first scan signal line SN may be smaller than a distance h3 between the third conductive part L3 and the first scan signal line SN, and the distance h3 between the third conductive part L3 and the first scan signal line SN may be smaller than or equal to the distance h2 between the second conductive part L2 and the first scan signal line SN. In this way, it is possible that the capacitance of the coupling capacitor C1>the capacitance of the coupling capacitor C3≥the capacitance of the coupling capacitor C2. Since the capacitance of the coupling capacitor C1>the capacitance of the coupling capacitor C3≥the capacitance of the coupling capacitor C2, the difference among the brightness rise degrees of the light-emitting elements of different colors is improved, and the color cast problem is improved.

Figure 12:
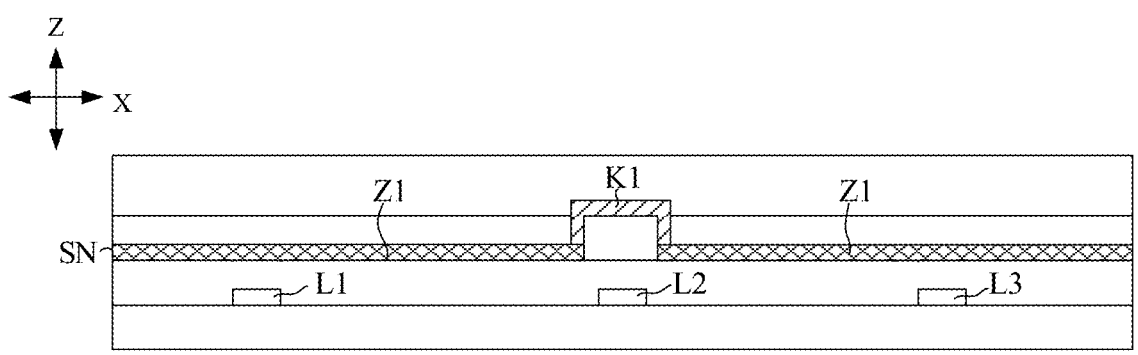
FIG. 12 is another schematic cross section view of a portion of a display panel provided by the embodiments of the present application.

FIG. 12 is another schematic cross section view of a portion of a display panel provided by the embodiments of the present application. As shown in FIG. 12, according to some embodiments of the present application, alternatively, the first scan signal line SN may include a first wiring portion Z1 and a cross-line portion K1 electrically connected to the first wiring portion Z1. The first wiring portion Z1 and the cross-line portion K1 may be arranged in different film layers. In the direction Z perpendicular to the plane where the display panel is located, at least one of the first conductive part L1 and the second conductive part L2 overlaps with the cross-line portion K1.

In this way, by arranging the cross-line portion K1, the distance between at least one of the first conductive part L1 and the second conductive part L2 and the first scan signal line SN may be adjusted, for example, the distance between the first conductive part L1 and first scan signal line SN is smaller than the distance between the second conductive part L2 and the first scan signal line SN. Thus, it is possible that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is greater than the capacitance of the coupling capacitor C2, the difference among the brightness rise degrees of the light-emitting elements of different colors is improved, and the color cast problem is improved.

Continuing to refer to FIG. 12, in some specific examples, alternatively, the first conductive part L1 and the second conductive part L2 are arranged in the same film layer. In the direction Z perpendicular to the plane where the display panel is located, the first conductive part L1 may overlap with the first wiring portion Z1, and the second conductive part L2 may overlap with the cross-line portion K1, and the film layer where the cross-line portion K1 is arranged is on a side of the film layer where the first wiring portion Z1 is arranged which is away from the film layer where the first conductive part L1 is arranged.

As shown in FIG. 7 and FIG. 12, in some examples, for example, the first conductive part L1 and the second conductive part L2 are arranged in the first active layer b1, and the first wiring portion Z1 may be arranged in the first metal layer M1 or the second metal layer M2 and the cross-line portion K1 may be arranged in the third metal layer M3, the fourth metal layer M4 or the fifth metal layer M5.

In this way, since a distance between the first conductive part L1 and the first wiring portion Z1 is smaller than a distance between the second conductive part L2 and the cross-line portion K1, it is possible that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is greater than the capacitance of the coupling capacitor C2, the difference among the brightness rise degrees of the light-emitting elements of different colors is improved, and the color cast problem is improved.

In some embodiments, the display panel 20 may further include the third conductive part L3. The third conductive part L3 may either overlap with the first wiring portion Z1 or overlap with the cross-line portion K1, which is not limited in the embodiments of the present application.

Figure 13:
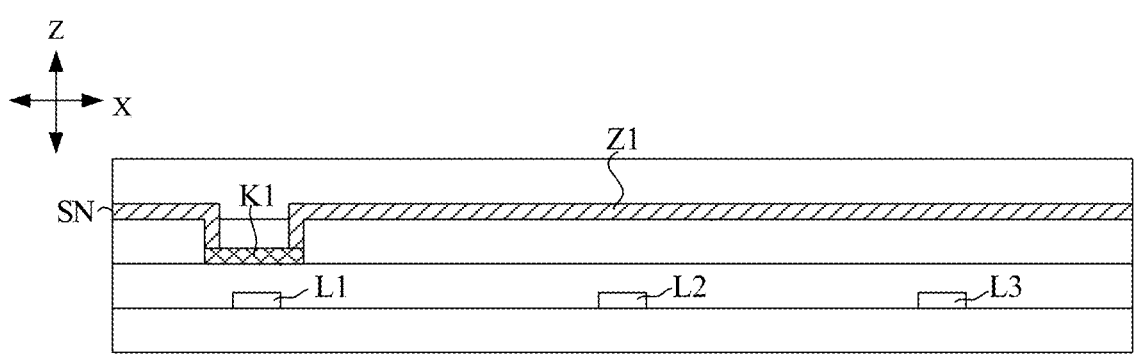
FIG. 13 is another schematic cross section view of a portion of a display panel provided by the embodiments of the present application.

FIG. 13 is another schematic cross section view of a portion of a display panel provided by the embodiments of the present application. As shown in FIG. 13, the embodiments of FIG. 13 different from the embodiments shown in FIG. 12 in that: according to other embodiments of the present application, alternatively, the first conductive part L1 and the second conductive part L2 are arranged in a same film layer. In the direction Z perpendicular to the plane where the display panel is located, the first conductive part L1 overlaps with the cross-line portion K1, the second conductive part L2 overlaps with the first wiring portion Z1, and the film layer where the cross-line portion K1 is arranged may be on a side of the film layer where the first wiring portion Z1 is arranged which is close to the film layer where the first conductive part L1 is arranged.

As shown in FIG. 7 and FIG. 13, in some examples, for example, the first conductive part L1 and the second conductive part L2 are arranged in the first active layer b1, and the cross-line portion K1 may be arranged in the first metal layer M1 or the second metal layer M2, and the first wiring portion Z1 may be arranged in the third metal layer M3, the fourth metal layer M4 or the fifth metal layer M5.

In this way, since the distance between the first conductive part L1 and the cross-line portion K1 is smaller than the distance between the second conductive part L2 and the first wiring portion Z1, it is possible that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is greater than the capacitance of the coupling capacitor C2, the difference among the brightness rise degrees of the light-emitting elements of different colors is improved, and the color cast problem is improved.

Figure 14:
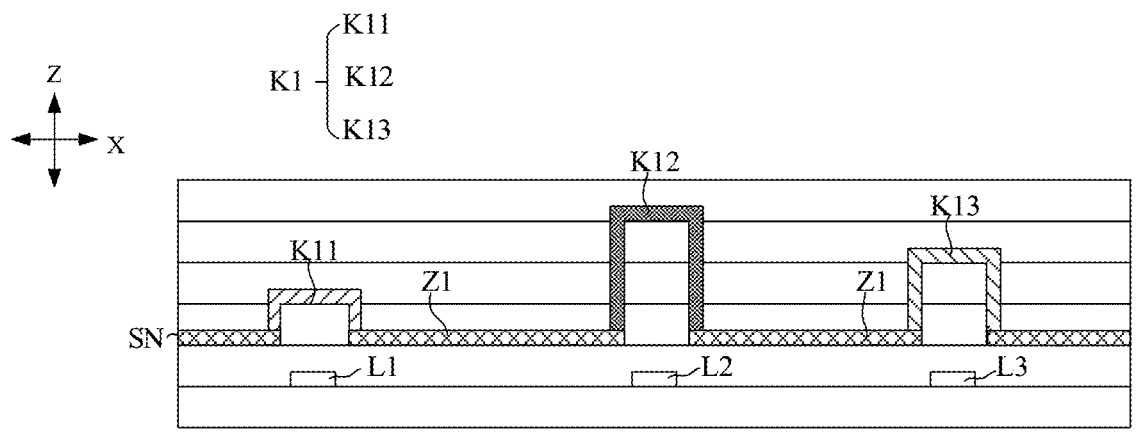
FIG. 14 is another schematic cross section view of a portion of a display panel provided by the embodiments of the present application.

FIG. 14 is another schematic cross section view of a portion of a display panel provided by the embodiments of the present application. As shown in FIG. 14, the embodiments of FIG. 14 different from the embodiments shown in FIG. 12 in that: according to further embodiments of the present application, alternatively, the cross-line portion K1 may include a first cross-line portion K11 and a second cross-line portion K12, and the first cross-line portion K11 and the second cross-line portion K12 are arranged in different film layers. In the direction Z perpendicular to the plane where the display panel is located, the first conductive part L1 overlaps with the first cross-line portion K11, and the second conductive part L2 overlaps with the second cross-line portion K12. In the direction Z perpendicular to the plane where the display panel is located, a distance between the film layer where the first conductive part L1 is arranged and the film layer where the first cross-line portion K11 is arranged is smaller than a distance between the film layer where the second conductive part L2 is arranged and the film layer where the second cross-line portion K12 is arranged.

As shown in FIG. 7 and FIG. 14, in some examples, for example, the first conductive part L1 and the second conductive part L2 are arranged in the first active layer b1, the first wiring portion Z1 may be arranged in the first metal layer M1, the first cross-line portion K11 may be arranged in the second metal layer M2, and the second cross-line portion K12 may be arranged in the third metal layer M3, the fourth metal layer M4 or the fifth metal layer M5. In other examples, for example, the first conductive part L1 and the second conductive part L2 are arranged in the first active layer b1, the first wiring portion Z1 may be arranged in the second metal layer M2, the first cross-line portion K11 may be arranged in the first metal layer M1, and the second cross-line portion K12 may be arranged in the third metal layer M3, the fourth metal layer M4 or the fifth metal layer M5.

In this way, since a distance between the first conductive part L1 and the first cross-line portion K11 is smaller than a distance between the second conductive part L2 and the second cross-line portion K12, it is possible that the capacitance of the coupling capacitor C1 generated between the scan signal line SN and the first conductive part L1 is greater than the capacitance of the coupling capacitor C2 generated between the first scan signal line SN and the second conductive part L2. Since the capacitance of the coupling capacitor C1 is greater than the capacitance of the coupling capacitor C2, the difference among the brightness rise degrees of the light-emitting elements of different colors is improved, and the color cast problem is improved.

Continuing to refer to FIG. 14, according to some embodiments of the present application, alternatively, the cross-line portion K1 may further include a third cross-line portion K13. In the direction Z perpendicular to the plane where the display panel is located, the third conductive part L3 overlaps with the third cross-line portion K13, and the distance between the film layer where the first conductive part L1 is arranged and the film layer where the first cross-line portion K11 is arranged may be smaller than a distance between the film layer where the third conductive part L3 is arranged and the film layer where the third cross-line portion K13 is arranged, and the distance between the film layer where the third conductive part L3 is arranged and the film layer where the third cross-line portion K13 is arranged may be smaller than or equal to the distance between the film layer where the second conductive part L2 is arranged and the film layer where the second cross-line portion K12 is arranged. That is, in the direction Z perpendicular to the plane where the display panel is located, the third cross-line portion K13 and the second cross-line portion K12 may be arranged in a same film layer, or the film layer where the third cross-line portion K13 is arranged is between the film layer where the first cross-line portion K11 is arranged and the film layer where the second cross-line portion K12 is arranged.

As shown in FIG. 7 and FIG. 14, in some examples, for example, the first conductive part L1, the second conductive part L2 and the third conductive part L3 are arranged in the first active layer b1, and the first wiring portion Z1 may be arranged in the first metal layer M1, the first cross-line portion K11 may be arranged in the second metal layer M2, the third cross-line portion K13 may be arranged in the third metal layer M3, and the second cross-line portion K12 may be arranged in the fourth metal layer M4 or the fifth metal layer M5. It should be noted that the above examples are only for illustration, and do not constitute a limitation to the embodiments of the present application. For example, in other examples, the first cross-line portion K11 may be arranged in the first metal layer M1, the first wiring portion Z1 may be arranged in the second metal layer M2, and the second cross-line portion K12 and the third cross-line portion K13 may be arranged in the third metal layer M3.

In this way, since the distance between the film layer where the first conductive part L1 is arranged and the film layer where the first cross-line portion K11 is arranged<the distance between the film layer where the third conductive part L3 is arranged and the film layer where the third cross-line portion K13 is arranged≤the distance between the film layer where the second conductive part L2 is arranged and the film layer where the second cross-line portion K12 is arranged, it is possible that the capacitance of the coupling capacitor C1>the capacitance of the coupling capacitor C3≥the capacitance of the coupling capacitor C2. Since the capacitance of the coupling capacitor C1>the capacitance of the coupling capacitor C3≥the capacitance of the coupling capacitor C2, the difference among the brightness rise degrees of the light-emitting elements of different colors is improved, and the color cast problem is improved.

As shown in FIG. 5 and FIG. 6, according to some embodiments of the present application, alternatively, the display panel may further include a second reference voltage signal line VREF2. The pixel circuit 100 includes the second transistor T2, and the first scan signal line SN may be reused as the gate of the second transistor T2. The second transistor T2 is connected to the second reference voltage signal line VREF2.

In particular, a gate of a driving transistor T0 may be electrically connected to a first node N1, and the driving transistor T0 is used for driving the light-emitting element D to emit light.

The gate of the second transistor T2 may be electrically connected to the scan signal line S1, a first electrode of the second transistor T2 may be electrically connected to the second reference voltage signal line VREF2, and a second electrode of the second transistor T2 may be electrically connected to the first node N1. The second transistor T2 is to be turned on in response to a turn-on level provided by the scan signal line S1, to transmit the second reference voltage signal provided by the second reference voltage signal line VREF2 to the first node N1, so as to reset the first node N1. The first scan signal line SN may include the scan signal line S1. That is, in some embodiments, the first scan signal line SN may particularly be the scan signal line S1 that controls the turn-on/turn-off of the second transistor T2.

As shown in FIG. 5 and FIG. 6, according to some embodiments of the present application, alternatively, the pixel circuit 100 may further include a threshold compensation transistor T3, a data writing transistor T4, a first light-emitting control transistor T5, and a second light-emitting control transistor T6 and a storage capacitor Cst.

The gate of the threshold compensation transistor T3 is electrically connected to a second scan signal line S2, a first electrode of the threshold compensation transistor T3 is electrically connected to the first node N1, and a second electrode of the threshold compensation transistor T3 is electrically connected to a first electrode of the driving transistor T0. The threshold compensation transistor T3 is to be turned on in response to a turn-on level provided by the second scan signal line S2, to connect the gate of the driving transistor T0 with the first electrode of the driving transistor T0, so as to cooperate with the data writing transistor to realize a threshold voltage compensation of drive transistor T0.

The gate of the data writing transistor T4 is electrically connected to a third scan signal line S3, a first electrode of the data writing transistor T4 is electrically connected to a data signal line data, and a second electrode of the data writing transistor T4 is electrically connected to the second electrode of the driving transistor T0. The data writing transistor T4 is to be turned on in response to a turn-on level provided by the third scan signal line S3 for writing data signal.

The third scan signal line S3 may reuse the scan signal line Scp.

The gate of the first light-emitting control transistor T5 is electrically connected to a light-emitting control signal line EM, a first electrode of the first light-emitting control transistor T5 is electrically connected to the first power supply voltage signal line PVDD, and a second electrode of the first light-emitting control transistor T5 is electrically connected to the second electrode of the driving transistor T0.

As for the second light-emitting control transistor T6, the gate of the second light-emitting control transistor T6 is electrically connected to the light-emitting control signal line EM, a first electrode of the second light-emitting control transistor T6 is electrically connected to the first electrode of the driving transistor T0, and a second electrode of the second light-emitting control transistor T6 is electrically connected to the first electrode of the light-emitting element D.

As for the storage capacitor Cst, a first electrode plate of the storage capacitor Cst is electrically connected to the first power supply voltage signal line PVDD, and the second electrode plate of the storage capacitor Cst is electrically connected to the first node N1 for maintaining the potential of the first node N1.

The display panel 20 of the embodiments of the present application may be applied with a low temperature polycrystalline oxide (LTPO) technology. That is, the pixel circuit of the display panel 20 may include both low temperature polysilicon thin film transistor and oxide thin film transistor.

In some embodiments, alternatively, the second reset transistor T2 and the threshold compensation transistor T3 may be oxide thin film transistors, so as to reduce a leakage current of the first node N1 and ensure the stability of the light-emitting element D for emitting light. The driving transistor T0, the first reset transistor T1, the data writing transistor T4, the first light-emitting control transistor T5 and the second light-emitting control transistor T6 may be low temperature polysilicon thin film transistors, thereby ensuring that the pixel circuit has a strong driving capability.

In some embodiments, alternatively, the second reset transistor T2 and the threshold compensation transistor T3 may be N-type transistors, so as to reduce the leakage current of the first node N1 and ensure the stability of the light-emitting element D for emitting light. The driving transistor T0, the first reset transistor T1, the data writing transistor T4, the first light-emitting control transistor T5 and the second light-emitting control transistor T6 may be P-type transistors, thereby ensuring that the pixel circuit has strong driving capability.

Figure 15:
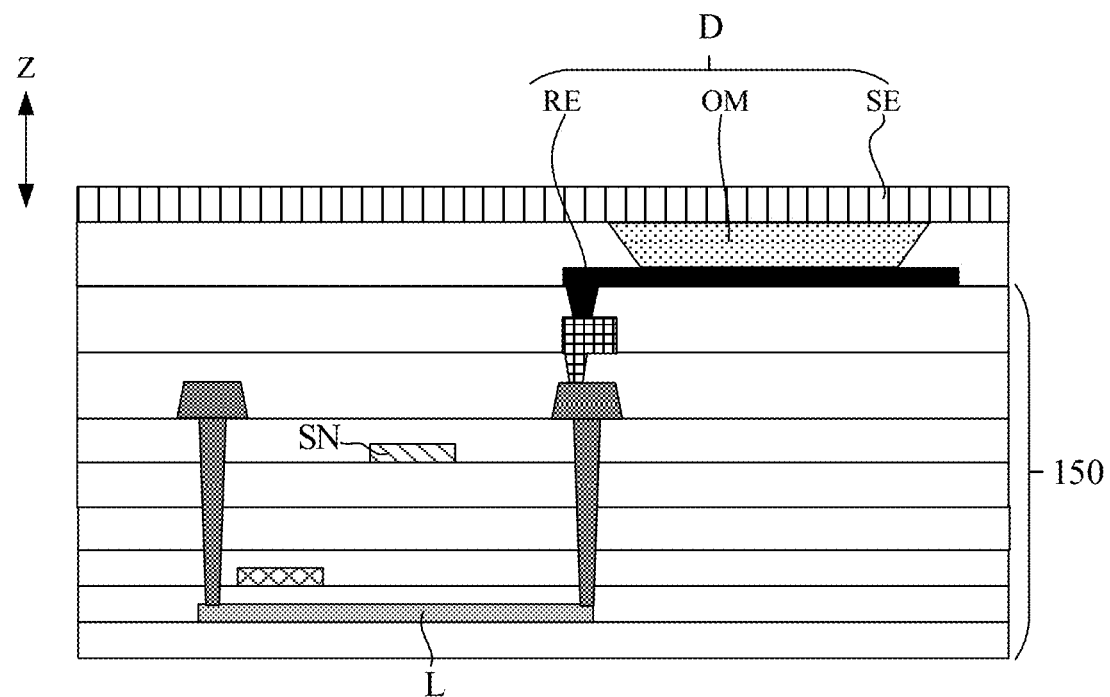
FIG. 15 is a schematic cross section view of a portion of a display panel provided by the embodiments of the present application.

FIG. 15 is a schematic cross section view of a portion of a display panel provided by the embodiments of the present application. As shown in FIG. 15, according to other embodiments of the present application, alternatively, the display panel 20 may include an array substrate 150. The light-emitting elements D may be arranged on the array substrate 150. The conductive parts L may be arranged in the array substrate 150, and the conductive parts L may be electrically connected to the light-emitting elements D through vias.

In particular, the light-emitting element D may include the first electrode RE, the second electrode SE, and the light-emitting layer OM between the first electrode RE and the second electrode SE. In the direction Z perpendicular to the plane where the display panel is located, the second electrode SE is arranged on a side of the first electrode RE away from the array substrate 150. The first electrode RE of the light-emitting element D may be the anode of the light-emitting element D, and the second electrode SE of the light-emitting element D may be the cathode of the light-emitting element D.

The conductive part L may be electrically connected to the first electrode RE of the light-emitting element D through a via.

Based on the same technical concept as the display panel provided by the above-mentioned embodiments, correspondingly, the embodiments of the present application further provide a display panel, and please refer to the embodiments below.

Figure 16:
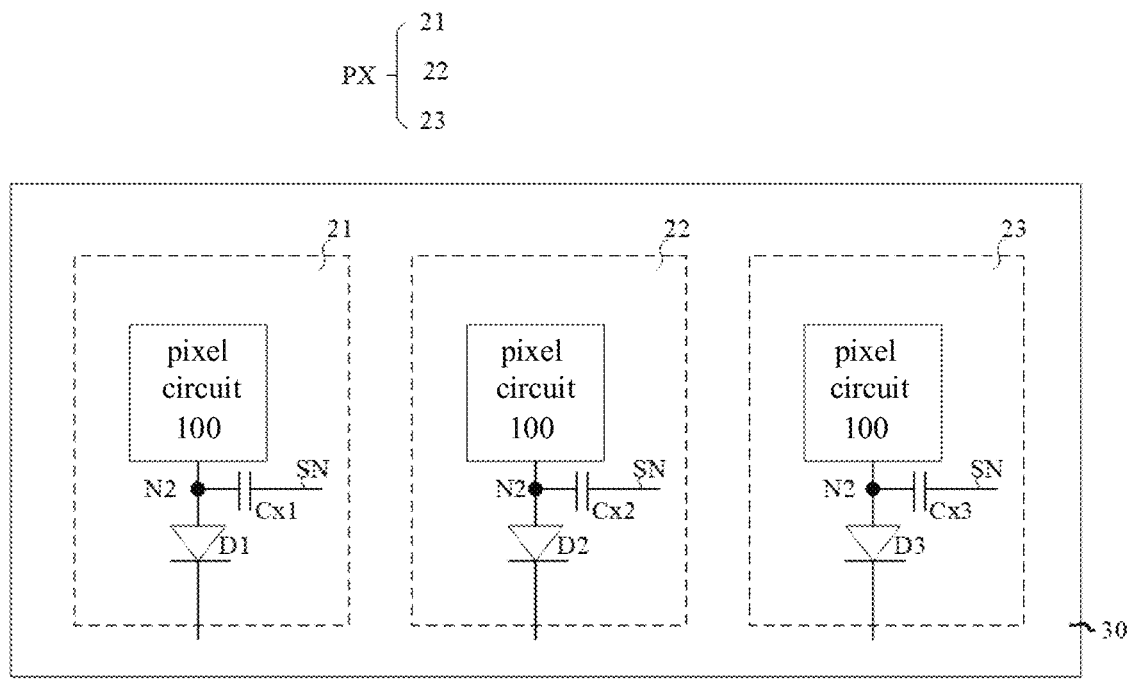
FIG. 16 is a schematic circuit diagram of a pixel circuit provided by the embodiments of the present application.

FIG. 16 is a schematic circuit diagram of a display panel provided by the embodiments of the present application. As shown in FIG. 16. the display panel 30 provided by the embodiments of the present application may include a first scan signal line SN, and the first scan signal line SN may be electrically connected to the gate of the transistor in the pixel circuit to control the turn-on/turn-off of the transistor. The display panel 30 may further include a plurality of sub-pixels PX, and each sub-pixel PX may include a pixel circuit 100, a light-emitting element D and a coupling capacitor Cx, and the coupling capacitor Cx is connected between the first scan signal line SN and the light-emitting element D. For example, the first electrode plate of the coupling capacitor Cx is electrically connected to the first scan signal line SN, and the second electrode plate of the coupling capacitor Cx is electrically connected to the first electrode of the light-emitting element D (i.e., the second node N2). The first electrode of the light-emitting element D may be the anode of the light-emitting element D, and the second electrode of the light-emitting element D may be the cathode of the light-emitting element D.

The plurality of sub-pixels PX may include a first-color sub-pixel 21 and a second-color sub-pixel 22. For ease of description, the coupling capacitor Cx in the first-color sub-pixel 21 is referred to as a first coupling capacitor Cx1, and the coupling capacitor Cx in the second-color sub-pixel 21 is referred to as a second coupling capacitor Cx2. The capacitance of the first coupling capacitor Cx1 is greater than the capacitance of the second coupling capacitor Cx2.

In this way, since the capacitance of the first coupling capacitor Cx1 is greater than the capacitance of the second coupling capacitor Cx2, when the scan signal output by the first scan signal line SN is switched from a low level to a high level, the potential rise degree of the first electrode of the first-color light-emitting element D1 by the first coupling capacitor Cx1 is greater than the potential rise degree of the first electrode of the second-color light-emitting element D2 by the second coupling capacitor Cx2. Thus, the brightness rise degree of the first-color light-emitting element D1 is increased, and the difference between the brightness rise degree of the first-color light-emitting element D1 and the brightness rise degree of the second-color light-emitting element D2 is improved, and the color cast problem is improved.

Continuing to refer to FIG. 16, according to some embodiments of the present application, alternatively, the plurality of sub-pixels PX may further include a third-color sub-pixel 23.

For ease of description, the coupling capacitor Cx in the third-color sub-pixel 23 is referred to as a third coupling capacitor Cx3. The capacitance of the first coupling capacitor Cx1 is greater than the capacitance of the third coupling capacitor Cx3, and the capacitance of the third coupling capacitor Cx3 is greater than or equal to the capacitance of the second coupling capacitor Cx2.

In this way, since the capacitance of the first coupling capacitor Cx1>the capacitance of the third coupling capacitor Cx3≥the capacitance of the second coupling capacitor Cx2, when the scan signal output by the first scan signal line SN is switched from a low level to a high level, the potential rise degree of the first electrode of the first-color light-emitting element D1 by the first coupling capacitor Cx1 is greater than the potential rise degree of the first electrode of the third-color light-emitting element D3 by the third coupling capacitor Cx3, and the potential rise degree of the first electrode of the third-color light-emitting element D3 by the third coupling capacitor Cx3 is greater than or equal to the potential rise degree of the first electrode of the second-color light-emitting element D2 by the second coupling capacitor Cx2. Thus, the difference among the brightness rise degree of the first-color light-emitting element D1, the brightness rise degree of the second-color light-emitting element D2 and the brightness rise degree of the third-color light-emitting element D3 is improved, and the color cast problem is improved.

It should be noted that the display panel 30 provided in the embodiments of the present application may have the same structure as the display panel 20 provided in the above-mentioned embodiments, that is, the display panel 30 may have the same or corresponding technical features as the display panel 20 provided in the above-mentioned embodiments, which will not be listed and described in detail here for the sake of brevity. All the features of the display panel 20 provided by the above embodiments may be applied to the display panel 30 provided by the embodiments of the present application.

Figure 17:
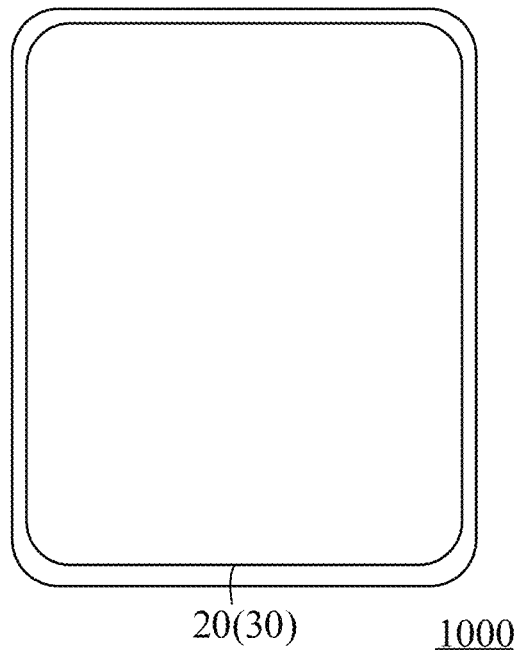
FIG. 17 is a schematic structure diagram of a display apparatus provided by the embodiments of the present application.

Based on the display panel provided by the above embodiments, correspondingly, the present application further provides a display apparatus including the display panel provided by the present application. Please refer to FIG. 17. FIG. 17 is a schematic structure diagram of a display apparatus provided by the embodiments of the present application. The display apparatus 1000 provided in FIG. 17 includes the display panel 20 or the display panel 30 provided by any of the above embodiments of the present application. The embodiment of FIG. 17 only takes a mobile phone as an example to describe the display apparatus 1000. It may be understood that the display apparatus provided by the embodiments of the present application may be a wearable product, a computer, a TV, a vehicle-mounted display apparatus, and other devices with a display function, which is not specifically limited in this application. The display apparatus provided by the embodiments of the present application has the beneficial effects of the display panel 20 or display panel 30 provided by the embodiments of the present application. For details, reference may be made to the specific descriptions of the display panel 20 or display panel 30 in the above-mentioned embodiments, which will not be repeated in this embodiment.

It should be understood that the specific structures of the circuits and the cross-sectional structures of the display panel provided in the accompanying drawings of the embodiments of the present application are only some examples, and are not intended to limit the present application. In addition, the above-mentioned embodiments provided by the present application may be combined with one another if there is no contradiction.

In accordance with the embodiments of the present application as described above, these embodiments do not exhaustively describe all the details, nor do they limit the application to only the specific embodiments described. Obviously, many modifications and variations are possible in light of the above description. These embodiments selected and described in the description are used to better explain the principles and practical applications of the present application, so that those skilled in the art may make good use of the present application and make modifications based on the present application. This application is to be limited only by the claims along with their scopes and equivalents.

The above are only specific implementations of the present application. Those skilled in the art can clearly understand that, for the ease and brevity of description, the specific operating process of the above-described systems, modules and units may refer to the corresponding process in the foregoing method embodiments, which will not be repeated here. It should be understood that the protection scope of the present application is not limited to this. Any person skilled in the art can easily conceive of various equivalent modifications or replacements within the technical scope disclosed in the present application, and these modifications or replacements should all fall within the protection scope of the present application.

What is claimed is:

1. A display panel, comprising:
   a plurality of light-emitting elements comprising a first-color light-emitting element and a second-color light-emitting element;
   a plurality of conductive parts electrically connected to the light-emitting elements, wherein in the plurality of conductive parts, a conductive part electrically connected to the first-color light-emitting element is a first conductive part, and a conductive part electrically connected to the second-color light-emitting element is a second conductive part; and
   a first scan signal line overlapped with and insulated from the conductive parts,
   wherein an overlapping area of the first scan signal line and the first conductive part is larger than an overlapping area of the first scan signal line and the second conductive part;
   the display panel further comprising a pixel circuit comprising a first transistor, the first transistor comprising an active layer;
   each of the plurality of conductive parts is formed by an extension part of the active layer.

2. The display panel according to claim 1, wherein
   the first-color light-emitting element is a blue-light-emitting element, and the second-color light-emitting element is a red-light-emitting element;
   the first-color light-emitting element is a blue-light-emitting element, and the second-color light-emitting element is a green-light-emitting element; or
   the first-color light-emitting element is a green-light-emitting element, and the second-color light-emitting element is a red-light-emitting element.

3. The display panel according to claim 1, wherein
   a capacitance of the first-color light-emitting element is greater than a capacitance of the second-color light-emitting element.

4. The display panel according to claim 1, further comprising a first reference voltage signal line,
   wherein the first transistor is electrically connected to a light-emitting element through a conductive part; and
   the first reference voltage signal line is electrically connected to the first transistor.

5. The display panel according to claim 4, wherein
   the conductive part and the active layer are arranged in a same layer.

6. The display panel according to claim 4, wherein
   the pixel circuit further comprises a second transistor;
   the first transistor comprises a first active layer comprising silicon;
   the second transistor comprises a second active layer and a second gate, and the second active layer comprises metal oxide;
   a film layer where the second active layer is arranged is between a film layer where the second gate is arranged and a film layer where the first active layer is arranged; and
   the conductive part and the first active layer are arranged in a same layer, and the first scan signal line comprises the second gate.

7. The display panel according to claim 1, further comprising a substrate, and a first active layer, a first metal layer, a second metal layer, a second active layer, a third metal layer, a fourth metal layer, a fifth metal layer, and an electrode layer which are arranged over the substrate and stacked in sequence,
   wherein the conductive parts and the first active layer are arranged in a same layer, and the first scan signal line is arranged in the third metal layer.

8. The display panel according to claim 7, further comprising:
   a first insulating layer between a film layer where the first active layer is arranged and the first metal layer;
   a second insulating layer between the first metal layer and the second metal layer;
   a third insulating layer between the second metal layer and a film layer where the second active layer is arranged; and
   a fourth insulating layer between the film layer where the second active layer is arranged and the third metal layer,
   wherein for regions where the first scan signal line overlaps with the conductive parts, the first insulating layer to fourth insulating layer are sandwiched between the first scan signal line and the conductive parts.

9. The display panel according to claim 1, wherein
   insulating layers between the first scan signal line and the conductive parts have a total thickness greater than 2000 angstroms and smaller than 10000 angstroms.

10. The display panel according to claim 1, further comprising pixel circuits electrically connected to the conductive parts,
- wherein the first scan signal line extends in a first direction, and
- for two pixel circuits adjacent in a second direction, the first scan signal line provides a signal to one of the two pixel circuits, and overlaps with a conductive part electrically connected to the other of the two pixel circuits, and
- wherein the first direction and the second direction intersect with each other.

11. The display panel according to claim 1, wherein the first scan signal line extends in a first direction, the conductive parts extend in a second direction, and the first direction and the second direction intersect with each other.

12. The display panel according to claim 11, wherein in the first direction, a portion of the first conductive part overlapped with the first scan signal line has a width greater than a width of a portion of the second conductive part overlapped with the first scan signal line.

13. The display panel according to claim 11, wherein in the second direction, a portion of the first scan signal line overlapped with the first conductive part has a width greater than a width of a portion of the first scan signal line overlapped with the second conductive part.

14. The display panel according to claim 11, wherein the first scan signal line comprises a first portion having a first width and a second portion having a second width, and the first width is greater than the second width;
the first portion overlaps with the first conductive part, and the second portion overlaps with the second conductive part; and
the first portion is a widened portion of the first scan signal line, and/or the second portion is a narrowed portion of the first scan signal line.

15. A display panel, comprising:
a plurality of light-emitting elements comprising a first-color light-emitting element and a second-color light-emitting element;
a plurality of conductive parts electrically connected to the light-emitting elements, wherein in the plurality of conductive parts, a conductive part electrically connected to the first-color light-emitting element is a first conductive part, and a conductive part electrically connected to the second-color light-emitting element is a second conductive part; and
a first scan signal line overlapped with and insulated from the conductive parts,
wherein an overlapping area of the first scan signal line and the first conductive part is larger than an overlapping area of the first scan signal line and the second conductive part; and
a distance between the first conductive part and the first scan signal line is smaller than a distance between the second conductive part and the first scan signal line.

16. The display panel according to claim 1, further comprising a pixel circuit and a second reference voltage signal line,
wherein the pixel circuit comprises a second transistor, and the first scan signal line is reused as a gate of the second transistor, and
the second transistor is connected to the second reference voltage signal line, and
wherein the second transistor is an N-type transistor.

17. The display panel of claim 1, further comprising an array substrate,
wherein the light-emitting elements are arranged on the array substrate; and
the conductive parts are arranged in the array substrate, and the conductive parts are electrically connected to the light-emitting elements through vias.

18. A display panel, comprising:
a first scan signal line; and
a plurality of sub-pixels, wherein each sub-pixel comprises a pixel circuit, a light-emitting element and a coupling capacitor, and the coupling capacitor is connected between the first scan signal line and the light-emitting element,
wherein the plurality of sub-pixels comprises a first-color sub-pixel and a second-color sub-pixel,
the coupling capacitor of the first-color sub-pixel is a first coupling capacitor, and the coupling capacitor of the second-color sub-pixel is a second coupling capacitor, and
a capacitance of the first coupling capacitor is greater than a capacitance of the second coupling capacitor;
the display panel further comprising:
a plurality of light-emitting elements comprising a first-color light-emitting element and a second-color light-emitting element;
a plurality of conductive parts electrically connected to the light-emitting elements, wherein in the plurality of conductive parts, a conductive part electrically connected to the first-color light-emitting element is a first conductive part, and a conductive part electrically connected to the second-color light-emitting element is a second conductive part;
the display panel further comprising a pixel circuit comprising a first transistor, the first transistor comprising an active layer; and
each of the plurality of conductive parts is formed by an extension part of the active layer; or
a distance between the first conductive part and the first scan signal line is smaller than a distance between the second conductive part and the first scan signal line.

19. A display apparatus comprising the display panel according to claim 1.